(12) United States Patent
Yabe et al.

(10) Patent No.: US 6,265,113 B1
(45) Date of Patent: Jul. 24, 2001

(54) STRESS ADJUSTMENT METHOD OF X-RAY MASK

(75) Inventors: Hideki Yabe; Kaeko Kitamura; Kenji Marumoto; Sunao Aya; Koji Kise, all of Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/116,334

(22) Filed: Jul. 16, 1998

(30) Foreign Application Priority Data

Jan. 21, 1998 (JP) .................................. 10-009461
Apr. 20, 1998 (JP) .................................. 10-108998

(51) Int. Cl.[7] .................................. G03F 9/00; G03F 1/16
(52) U.S. Cl. .................................. 430/5; 378/34; 378/35
(58) Field of Search .................................. 430/5, 322; 378/34, 378/35

(56) References Cited

U.S. PATENT DOCUMENTS

| 5,188,706 | * | 2/1993 | Hori et al. .................................. 430/5 |
| 5,677,090 | | 10/1997 | Marumoto et al. .................................. 430/5 |

FOREIGN PATENT DOCUMENTS

| 62194620 | 8/1987 | (JP) . |
| 7135157 | 5/1995 | (JP) . |
| 9-306812 | 11/1997 | (JP) . |

OTHER PUBLICATIONS

Marumoto et al., "Total Evaluation Of W–Ti Absorber For X–ray Mask", SPIE, vol. 2194, Feb. 1994, pp. 221–230.

Marumoto et al., "A Strategy For Highly Accurate X–ray Masks", Digest of Papers XEL '95, Jul. 1995, pp. M621–M622.

Marumoto et al., "Fabrication of X–ray Masks For Giga–bit DRAM By Using A SiC Membrane and W–Ti Absorber", Journal of Vacuum Science, vol. B14, No. 16, Nov. 1966, pp. 4359–4362.

Yabe et al., "Fine Stress Control Of X–ray Mask Materials", Digest of Papers XEL '97, Jul. 1997, pp. 151–152.

* cited by examiner

*Primary Examiner*—S. Rosasco
(74) *Attorney, Agent, or Firm*—Leydig, Voit & Mayer, Ltd.

(57) ABSTRACT

An X-ray absorber is deposited on a membrane. A stress adjust step is applied so that the average film stress of the X-ray absorber is 0. After patterning the X-ray absorber, the position accuracy of the pattern is measured. Then, a stress adjust process is applied to the patterned X-ray mask. Accordingly, a stress adjustment method is used to acquire an X-ray mask that has no pattern position offset of the X-ray absorber.

18 Claims, 27 Drawing Sheets

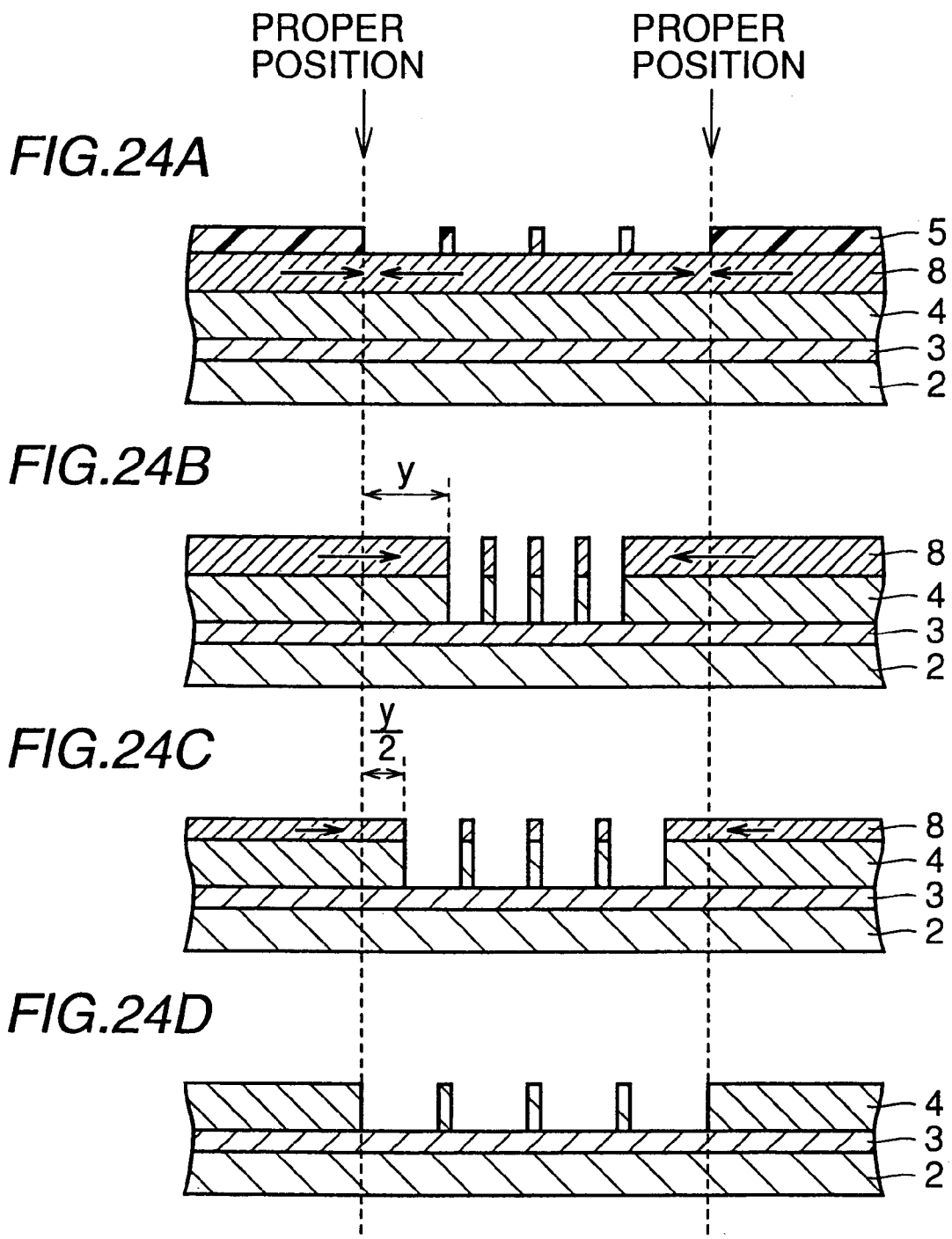

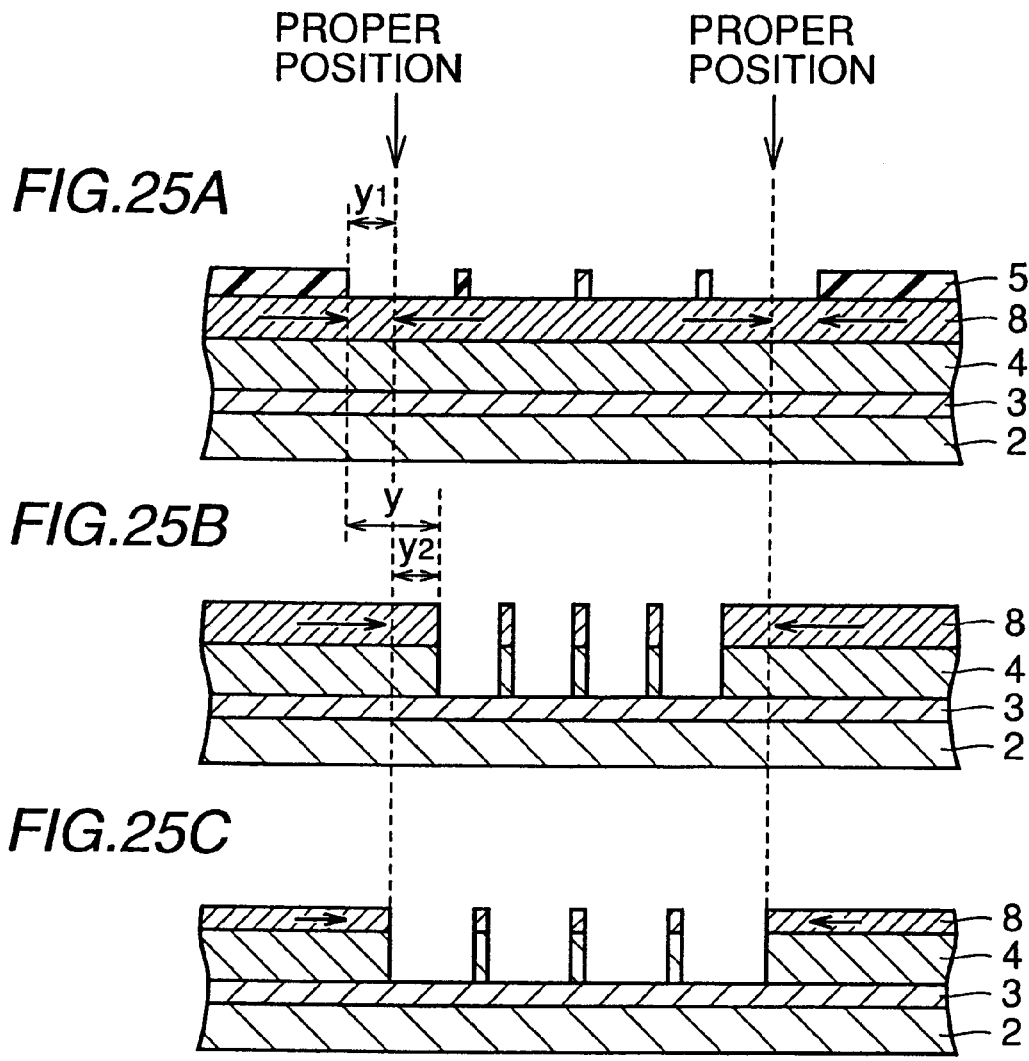

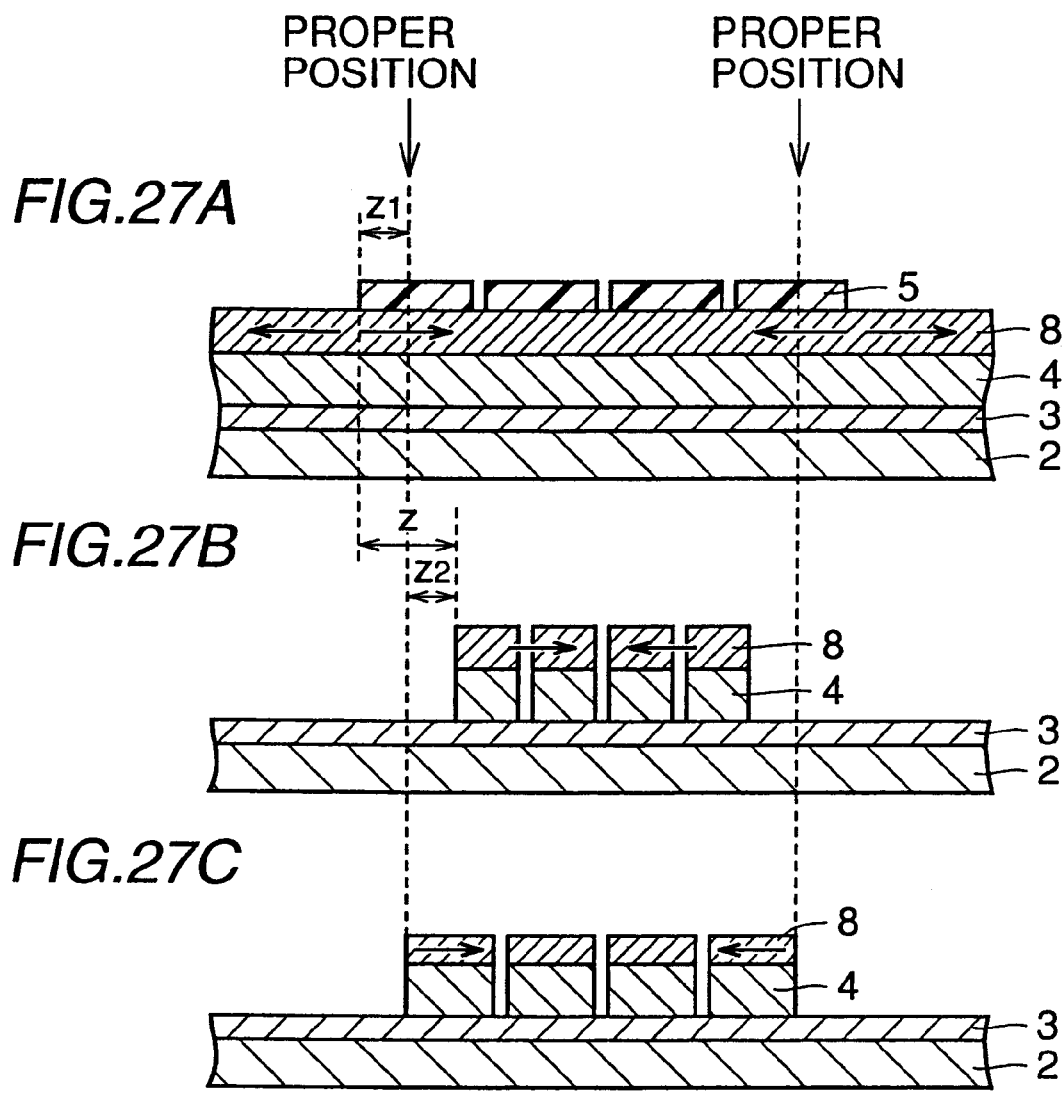

32 31 32

STRESS ADJUSTMENT METHOD OF X-RAY MASK

BACKGROUND OF THE INVENTION

1. Field of the Invention

The present invention relates to a method of adjusting the stress of an X-ray mask.

2. Description of the Background Art

In the conventional pattern transfer process of a semiconductor memory device that does not have such a high integration density, a lithographic technique employing ultraviolet light was mainly used. However, as semiconductor memory devices are scaled to higher densities such as a 1G-bit (gigabit) DRAM (Dynamic Random Access Memory), pattern transfer of higher resolution is required since each pattern such as the interconnection pattern is in the submicron range according to the device rule.

Attention is directed to lithography employing X-rays for such microscopic patterns. In the X-ray lithography technique, the wavelength of the X-rays (soft X-rays: $\lambda$=5–20 nm) emitted as the exposure light is shorter than that of ultraviolet light. Therefore, a pattern having a resolution higher than that produced by ultraviolet light lithography can be transferred.

Fabrication of an X-ray mask employed in such X-ray lithography is disclosed in Japanese Patent Laying-Open No. 7-135157 by the applicant of the present application.

A method of fabricating an X-ray mask disclosed in the publication thereof will be described hereinafter as conventional art.

FIGS. 38–44 are sectional views of such a conventional X-ray mask indicating the sequence of a fabrication method thereof.

Referring to FIG. 38, a membrane (a synonym for an X-ray transmittance substrate) 2 is formed on a silicon substrate 1.

Referring to FIG. 39, a portion of silicon substrate 1 is selectively removed (back etching) until the back surface of membrane 2 is partially exposed.

Referring to FIG. 40, an anti-reflective film also serving as an etching stopper film (referred simply as "anti-reflective film" hereinafter) formed of, for example, indium-tin oxide (ITO) is applied or sputtered on membrane 2. Then, a baking process is applied.

Referring to FIG. 41, an X-ray absorber 4 of a material that blocks transmission of X-ray is formed by, for example, sputtering, on anti-reflective film 3. Here, the average film stress of X-ray absorber 4 is measured. Annealing is carried out uniformly in an oven, for example, at 250° C. to attain an average film stress of 0.

Referring to FIG. 42, following application of a resist 5 on X-ray absorber 4, a baking process is carried out at 180° C., for example.

Referring to FIG. 43, a support ring 6 is attached to the bottom surface of silicon substrate 1 by an adhesive 7. Resist 5 is patterned by electron beam (EB) exposure and development. Using the patterned resist 5 as a mask, X-ray absorber 4 is subjected to dry etching, whereby X-ray absorber 4 is patterned. Then, resist 5 is removed. Thus, the X-ray mask shown in FIG. 44 is produced.

In the conventional stress adjustment method of an X-ray mask, the average film stress of X-ray absorber 4 is set to 0 right after formation of X-ray absorber 4 during the fabrication process of an X-ray mask.

Although X-ray lithography is applied in the transfer process of microscopic patterns due to the short wavelength of the X-ray, this transfer is generally in equal scale due to the nature of an X-ray. Therefore, high position accuracy of the pattern is required for the X-ray mask. When there is residual stress in X-ray absorber 4 prior to the patterning step of X-ray absorber 4, the pattern position of X-ray absorber 4 will be shifted by that stress after the patterning process of X-ray absorber 4 to result in degradation of the position accuracy.

In the conventional method of fabricating an X-ray mask, annealing is carried out before the patterning process of X-ray absorber 4 so that the average film stress of X-ray absorber 4 is adjusted to be 0.

However, the inventors of the present invention found that the pattern position of X-ray absorber 4 is shifted after the patterning process even if the average film stress of X-ray absorber 4 is set to 0 prior to the patterning process. The inventors extended intensive efforts to elucidate the cause. They have come to the following five factors which will be described in detail hereinafter.

(1) As shown in FIG. 40, the baking process is carried out after application of anti-reflective film 3. The surface of anti-reflective film 3 is oxidized as shown in FIG. 45 by this baking, whereby an oxide film 3a is formed. Compressive stress is generated in oxide film 3a by introduction of oxygen.

Following adjustment of the average film stress of X-ray absorber 4 to 0, etching is carried out to pattern X-ray absorber 4 as shown in FIGS. 43 and 44. When oxide film 3a located at the top surface of anti-reflective film 3 is selectively removed by this etching as shown in FIG. 46, the compressive stress is eliminated at the removed portion. The stress of this portion becomes tensile stress. As a result, the pattern of X-ray absorber 4 is pulled in the direction indicated by the arrow. Thus, offset is generated in the pattern position.

(2) Following the patterning of X-ray absorber 4 of FIG. 44, an oxide film 4a is formed by native oxidation as shown in FIG. 47 at the sidewall of X-ray absorber 4. At this oxide film 4a, compressive stress is generated by introduction of oxygen. The formation of oxide film 4a at a sidewall causes compressive stress in the direction indicated by the arrow to be exerted at the side of X-ray absorber 4. As a result, the pattern position is shifted.

(3) In the patterning step of X-ray absorber 4 shown in FIGS. 43 and 44, the sidewall of X-ray absorber 4 may be patterned obliquely as shown in FIG. 48(a) to exhibit the phase shifting effect. In this case, the phase of the transmitted light of sidewall 32 differs relative to the phase of the transmitted light of transmitting portion 31 as shown by the dotted line in FIG. 48(b). In the overlapping area of the exposure light transmitted through transmitting portion 31 and the exposure light transmitting through sidewall portion 32, the exposure light may cancel each other. As a result, a region is generated where the light intensity is reduced as shown by the solid line to facilitate transfer of a microscopic pattern. The solid line in FIG. 48(b) indicates the sum of the light intensity of light transmitting through each portion.

The general stress distribution within X-ray absorber 4 is shown in FIG. 49. Compressive stress is exhibited at the lower side of X-ray absorber 4, and tensile stress is exerted at the upper side of X-ray absorber 4. When a pattern of X-ray absorber 4 having an oblique sidewall as shown in FIG. 50 is formed, the compressive stress and the tensile stress are offset to result in an average film stress of 0 at the portion $4b_2$ having a cross section of substantially a quadrilateral. However, the compressive stress will become greater at the portion $4b_1$ where the cross section is substantially a triangle.

As a result, the sidewall of the X-ray absorber pattern exhibits compressive stress as shown in FIG. 51 to cause pattern position offset in the direction indicated by the arrow.

(4) The X-ray mask is used in X-ray lithography. In the case where anti-reflective film 3 of FIG. 44 is formed of, for example, $SiO_2$, the bond between Si and O of $SiO_2$ is broken by projection of the X-ray to alter the value of stress. As a result, the pattern of X-ray absorber 4 is offset in position.

(5) In the case where there is a defect in the patterned X-ray absorber 4, the defect must be corrected by means of FIB, laser, and the like. However, defect correction of a great range will cause position offset in the X-ray absorber pattern.

SUMMARY OF THE INVENTION

An object of the present invention is to provide an X-ray mask stress adjustment method for obtaining an X-ray mask without position offset in the X-ray absorber pattern.

In the stress adjustment method of an X-ray mask of the present invention, a stress adjust process is applied on the X-ray mask including an X-ray absorber after the X-ray absorber formed of a material blocking transmission of an X-ray is patterned.

Therefore, even if the position of the pattern is offset after the patterning step of the X-ray absorber, this position offset can be corrected by adjusting the stress. As a result, an X-ray mask of no or almost no position offset can be obtained. Therefore, the yield in the fabrication of an X-ray mask can be improved. Also, offset in the pattern position occurring over time in usage of the X-ray mask can be corrected.

Preferably, the stress adjust process includes the step of subjecting the X-ray mask to at least one step selected from the group consisting of annealing, ion implantation, etching, film growing, oxidation, and reduction.

Accordingly, various positions offsets can be accommodated.

Preferably, an anti-reflective film of a material that prevents reflection of alignment light is formed at the underlying layer of the X-ray absorber. The patterning step of the X-ray absorber is carried out by selectively etching the X-ray absorber until the surface of the anti-reflective film is exposed. The stress adjust process includes the step of oxidizing the surface of the exposed anti-reflective film.

Accordingly, offset in the pattern position caused when the anti-reflective film is over-etched can be corrected.

Preferably, the stress adjust process includes the step of applying an anneal process on the X-ray absorber that is patterned and that has an oxide film formed at the sidewall.

Accordingly, the pattern position offset caused by the native oxidation of the X-ray absorber after the patterning step can be corrected.

Preferably, the patterning step of the X-ray absorber is carried out by etching the sidewall of the X-ray absorber to be oblique. The step of applying a stress adjust process includes the step of annealing the patterned X-ray absorber.

Accordingly, pattern position offset caused by making the sidewall of the X-ray absorber oblique, to provide a phase shift effect, can be corrected.

Preferably, the X-ray mask stress adjustment method further includes the step of measuring the placement error of the patterned X-ray absorber. The stress of the X-ray mask is adjusted according to the measured placement error.

Thus, stress adjustment can be performed according to the measured placement error.

Further preferably, in the X-ray mask stress adjustment method, the step of measuring the placement error of the patterned X-ray absorber and the step of adjusting the stress of the X-ray mask are repeated to reduce the placement error.

Thus, the pattern position offset can be corrected.

The X-ray mask stress adjustment method further includes the step of computing the process condition to set the X-ray absorber pattern placement error substantially to 0 according to the measured placement error. The X-ray mask is subjected to a stress adjust process according to the process condition.

Accordingly, the pattern position offset can be corrected without repeating the measurement step of the pattern position offset of the X-ray absorber and stress adjustment step.

In the X-ray mask stress adjustment method, a stress process is preferably carried out after exposing the X-ray mask with X-rays.

Accordingly, even when the pattern of the X-ray absorber is shifted in position over time by X-ray irradiation, that pattern position offset can be corrected.

In the X-ray mask stress adjustment method, the step of patterning the X-ray absorber is carried out by etching the X-ray absorber using a patterned mask layer as a mask after the mask layer formed on the X-ray absorber is patterned using the resist pattern. The step of applying a stress adjustment process is carried out after measuring the position accuracy of the patterned X-ray absorber, and by etching the mask layer.

Accordingly, the pattern position offset of the X-ray absorber can be corrected.

In the X-ray mask stress adjustment method, the step of etching the mask layer is preferably carried out by etching so that no mask layer is left.

Accordingly, the position offset of the X-ray absorber pattern can be corrected.

In the X-ray mask stress adjustment method, the step of etching the mask layer is preferably carried out by etching so that no mask layer is left.

Accordingly, the position offset of the X-ray absorber pattern can be corrected.

In the X-ray mask stress adjustment method, following the overall removal of the mask layer by etching, the X-ray absorber is etched so that a portion thereof is removed.

Accordingly, the stress of the X-ray absorber is adjusted, so that the position offset of the X-ray absorber pattern can be corrected.

In the X-ray mask stress adjustment method, measurement of the position accuracy and mask layer removal are preferably carried out repeatedly.

Accordingly, the position offset of the X-ray absorber pattern can be minimized.

In the X-ray mask stress adjustment method, when the resist is of the positive type and the mask layer has tensile stress, or when the resist is of the negative type and the mask layer has compressive stress, the resist pattern region is formed smaller than the X-ray absorber pattern region subjected to a stress adjust process.

Accordingly, the position offset of the X-ray absorber pattern can be corrected to the vicinity of 0 even when there is residual stress in the X-ray absorber.

In the X-ray mask stress adjustment method, when the resist is of the positive type and the mask layer has compressive stress or when the resist is of the negative type and the mask layer has tensile stress, the resist pattern region is formed greater than the X-ray absorber pattern region subjected to a stress adjust process.

Accordingly, the position offset of the X-ray absorber pattern can be corrected to the vicinity of 0 even when there is residual stress in the X-ray absorber.

In the X-ray mask stress adjustment method, the resist is preferably of the positive type and the mask layer preferably has the tensile stress.

Accordingly, the position offset of the X-ray absorber pattern caused by exposing an X-ray on the X-ray mask can be corrected.

In the X-ray mask stress adjustment method, the resist is preferably of the negative type and the mask layer has the compressive stress.

Accordingly, the position offset of the X-ray absorber pattern caused by exposing an X-ray on the X-ray mask by X-ray can be corrected.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 24A–24D show a stress adjustment method in order when the resist is of a positive type and the etching mask has compressive stress.

FIGS. 25A–25C show a stress adjustment method in sequence when there is residual stress in the X-ray absorber.

FIGS. 27A–27C show a stress adjustment method in sequence when there is residual stress in the X-ray absorber.

DESCRIPTION OF THE PREFERRED EMBODIMENTS

Embodiments of the present invention will be described hereinafter with reference to the drawings.

First Embodiment

Figure 1:
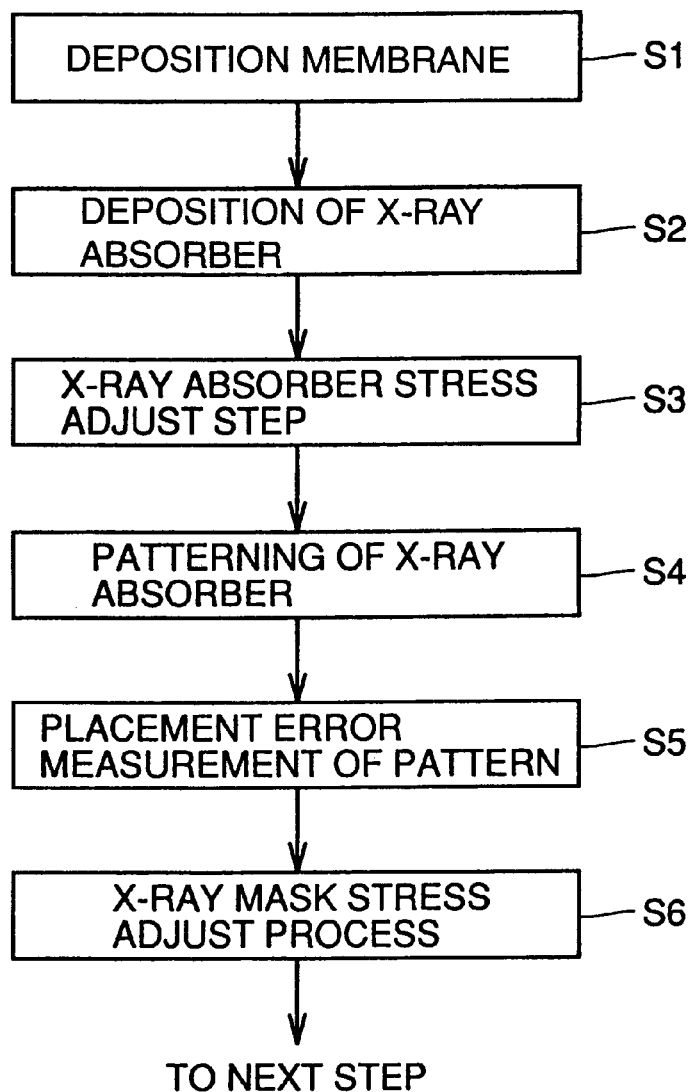
FIG. 1 shows a stress adjustment method of an X-ray mask according to a first embodiment of the present invention.
Figure 2:
FIGS. 2–8 are sectional views of an X-ray mask showing the sequence of a stress adjustment method thereof according to the first embodiment.

Referring to FIGS. 1 and 2, a membrane 2 formed of a light element in a thickness of, for example, 1–2 $\mu$m is deposited on a silicon substrate 1 (step S1).

Figure 3:
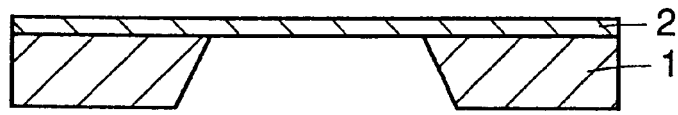

Referring to FIGS. 1 and 3, a portion of silicon substrate 1 is selectively back-etched until a portion of the bottom surface of membrane 2 is exposed.

Figure 4:
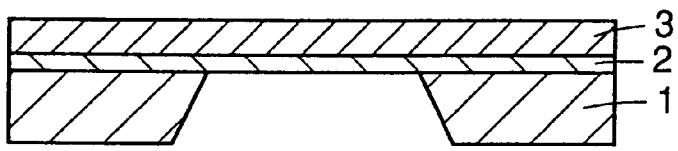

Referring to FIGS. 1 and 4, an anti-reflective film formed of, for example, indium.tin oxide (ITO) and also serving as an etching stopper film (referred simply as "anti-reflective film" hereinafter) 3 is applied on membrane 2. Then, a baking process is applied. Anti-reflective film 3 is formed of a material that reflects alignment light.

Figure 5:
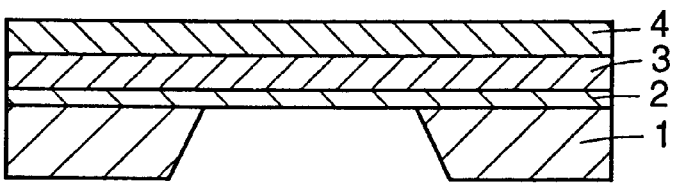

Referring to FIGS. 1 and 5, an X-ray absorber 4 formed of a tungsten-titanium film is deposited on anti-reflective film 3 by, for example, sputtering (step S2). The average film stress of X-ray absorber 4 is measured at this stage. The temperature of the heat treatment is determined to set this average film stress to 0. By annealing uniformly at the determined temperature, the average film stress of X-ray absorber 4 is adjusted to 0 (step S3).

The process of adjusting the stress of X-ray absorber 4 is not limited to this annealing step, and ion implantation, if suitable, surface oxidation and surface reduction of X-ray absorber 4 can be employed.

Figure 6:
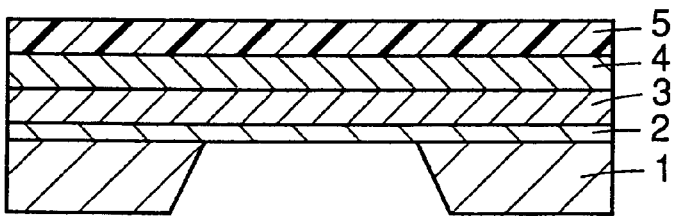

Referring to FIGS. 1 and 6, following application of a resist 5 on X-ray absorber 4, baking is carried out at, for example 180° C.

Figure 7:
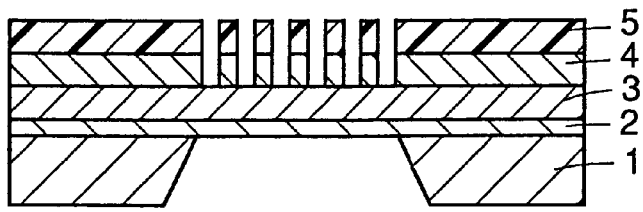

Referring to FIGS. 1 and 7, resist 5 is patterned by electron beam exposure (EB) and development. Using the patterned resist 5 as a mask, X-ray absorber 4 is dry-etched to pattern X-ray absorber 4 (step S4). Then, resist 5 is removed.

Then, the position accuracy of the X-ray absorber pattern is measured by, for example, laser interference (step S5) according to the method shown in FIG. 1. When there is position offset in the pattern of X-ray absorber 4, a stress adjust process is applied to the X-ray mask (step S6) to correct position offset of the pattern of X-ray absorber 4.

Figure 8:
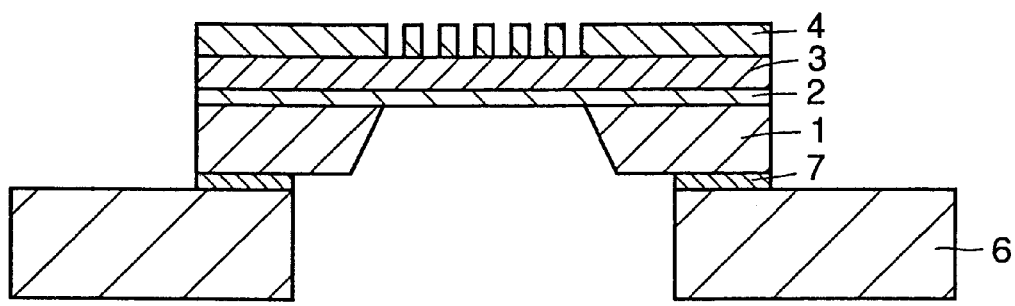

Then, a support ring 6 is attached to the back surface of silicon substrate 1 with an adhesive 7 to result in the state shown in FIG. 8.

Figure 9:
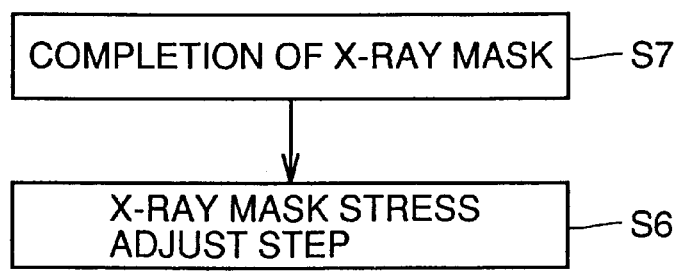
FIG. 9 shows that the stress adjustment step can be performed after forming an X-ray mask.

The above-described X-ray mask stress adjust process (step S6) can be carried out after completion of an X-ray mask (step S7) as shown in FIG. 9. For example, the X-ray mask can be subjected to a stress adjust process after being used in X-ray lithography. The stress adjust process (step S6) can be carried out periodically.

The stress adjust process (step S6) after the patterning step of X-ray absorber 4 can be carried out by any of the processes of annealing, ion implantation, etching of X-ray absorber 4, a deposition of some film, oxidation, reduction, and the like.

In the present embodiment, support ring 6 is attached after the stress adjust process (step S6). However, the stress adjust process (step S6) can be performed after attachment of support ring 6. Therefore, there are cases where this stress adjust process (step S6) becomes the last step in fabricating an X-ray mask. Also, the stress adjust process (step S6) can be performed prior to etching back silicon substrate 1 depending upon the process. In this case, there is possibility of overall pattern bias when back etching is carried out after the stress adjust process (step S6). In this case, the stress adjust process can be applied again.

Specific stress adjustment methods of the present invention will be described in detail according to second to fifth embodiments.

Second Embodiment

Figure 10:
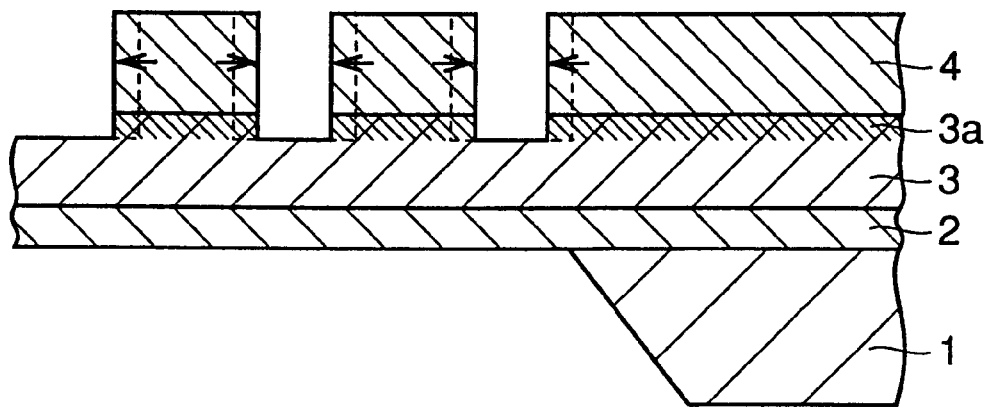
FIGS. 10 and 11 are sectional views of an X-ray mask indicating the sequence of a stress adjustment method thereof according to a second embodiment of the present invention.
Figure 45:
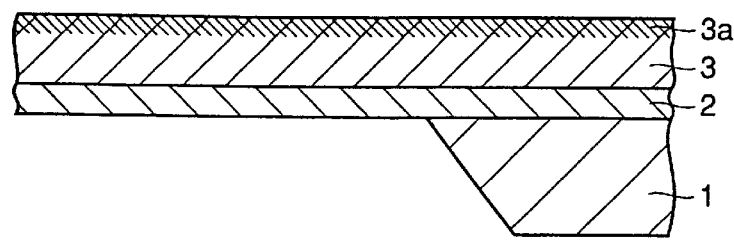
FIGS. 45 and 46 are diagrams for describing in sequence the pattern position offset when the anti-reflective film is overetched.
Figure 46:
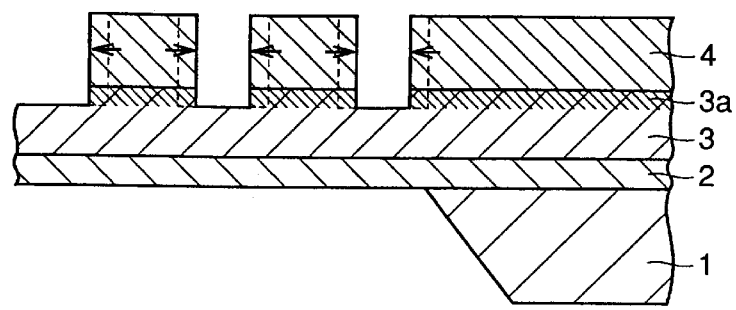
Figure 47:
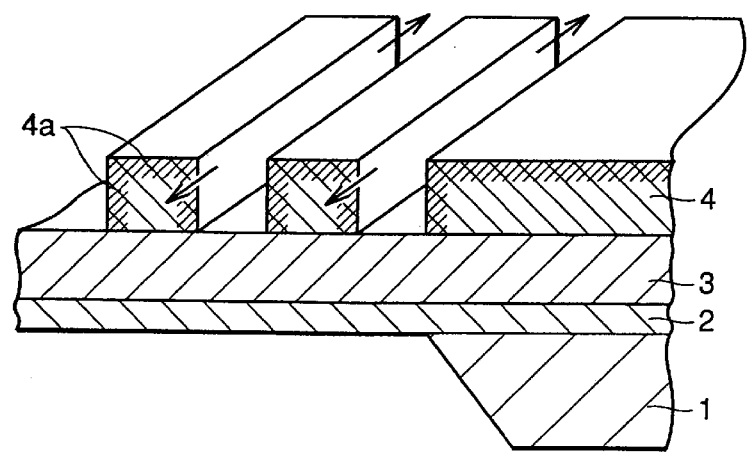
FIG. 47 is a schematic perspective view for describing occurrence of pattern position offset caused by native oxidization after the patterning step of the X-ray absorber.
Figure 48A:
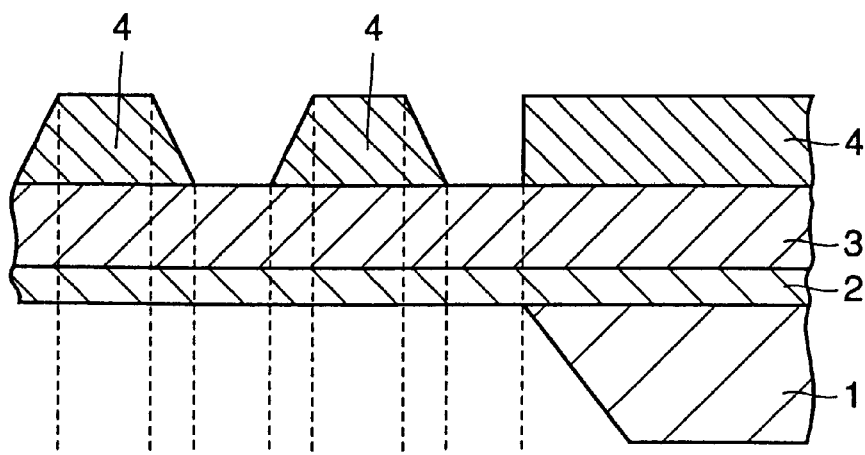
FIGS. 48A and 48B show a sectional view and a light intensity distribution when the pattern of the X-ray absorber is set to a configuration in which the phase shift effect is achieved.
Figure 48B:
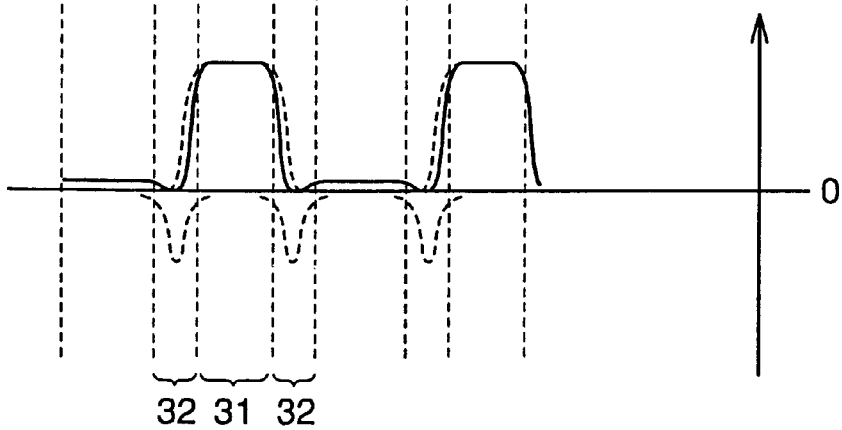
Figure 49:
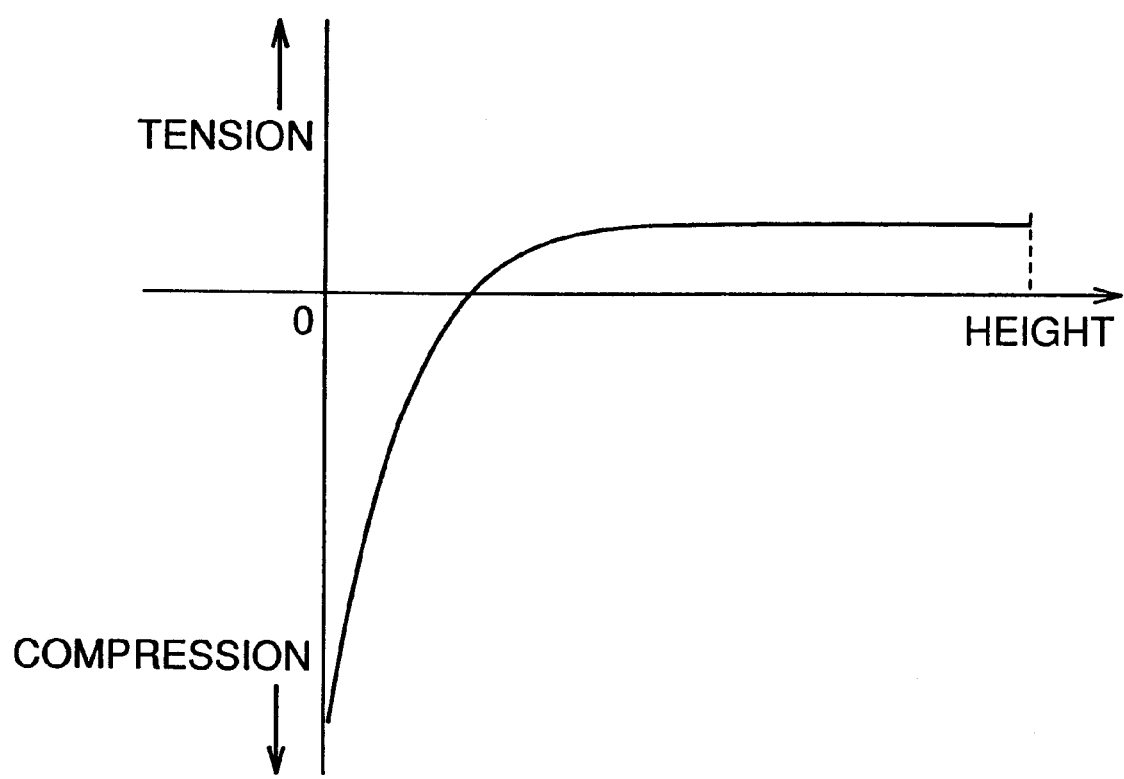
FIG. 49 shows the stress distribution from the bottom layer to the top layer of the X-ray absorber.
Figure 50:
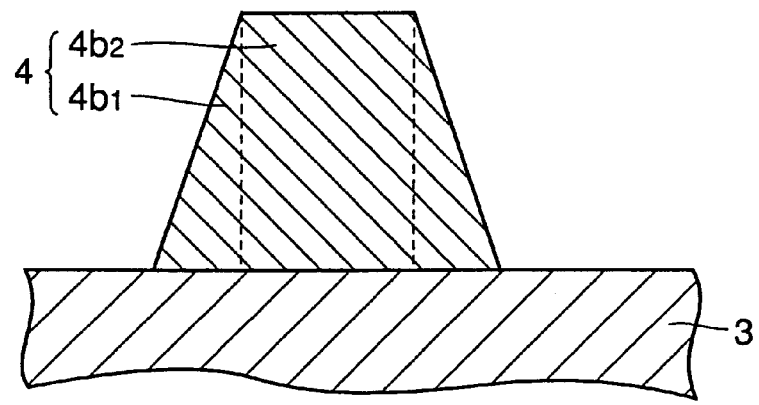
FIG. 50 is a sectional view of the X-ray absorber pattern partially enlarged.
Figure 51:
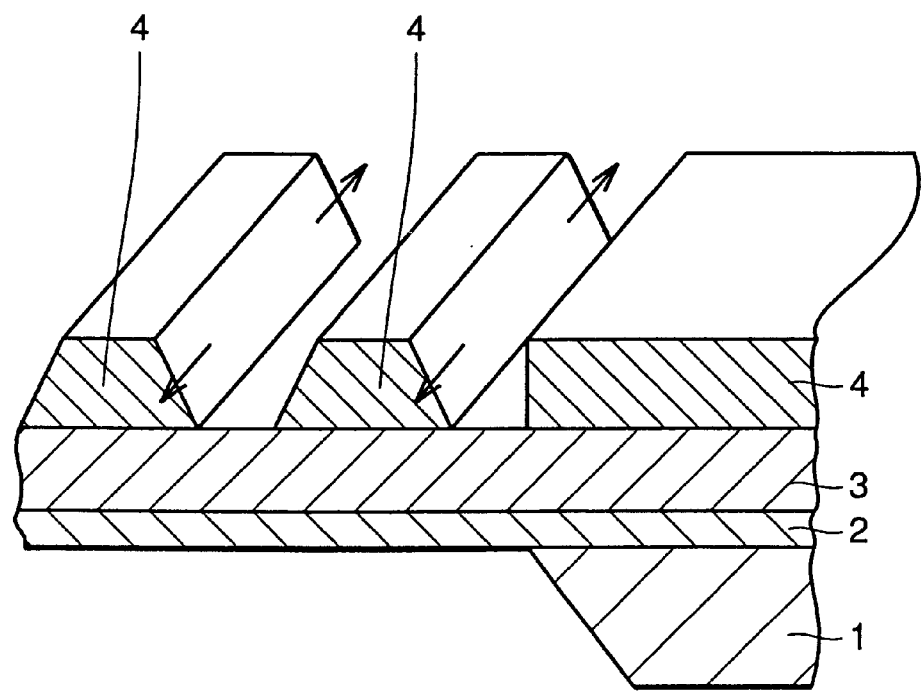
FIG. 51 is a schematic perspective view for describing occurrence of pattern position offset when the pattern of the X-ray absorber is set to a configuration in which the phase shift effect is achieved.

By baking anti-reflective film 3 as shown in FIG. 4, an oxide film 3a is formed at the surface of anti-reflective film 3 as shown in FIG. 45. Compressive stress is present by the introduction of oxygen into oxide film 3a. Therefore, if this oxide film 3a is selectively removed in patterning of X-ray absorber 4, the pattern position of X-ray absorber 4 is shifted in the direction indicated by the arrow in FIG. 10.

In the present embodiment, oxidation is carried out in, for example, UV ozone or in an oxygen atmosphere for the stress adjust process to compensate for the position offset.

Figure 11:
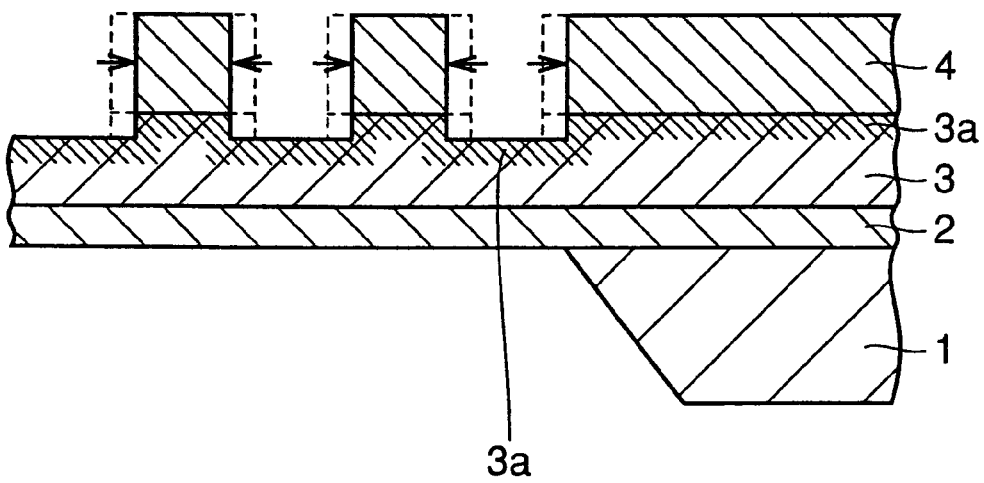

Referring to FIG. 11, the exposed bottom wall and sidewall of anti-reflective film 3 from X-ray absorber 4 are oxidized. Oxygen is introduced into the exposed area, so that the stress thereof becomes compressive stress. By the change in stress due to introduction of oxygen, the pattern of X-ray absorber 4 is shifted to correct position offset as shown by the arrow.

In the present embodiment, oxidation carried out after the patterning step of X-ray absorber 4 allows pattern position offset to be corrected that occurs when anti-reflective film 3 is overetched.

The present invention is described for the case where X-ray absorber 4 is patterned after silicon substrate 1 is etched back. A similar effect can be obtained even when X-ray absorber 4 is patterned prior to etching back silicon substrate 1.

Third Embodiment

Figure 12:
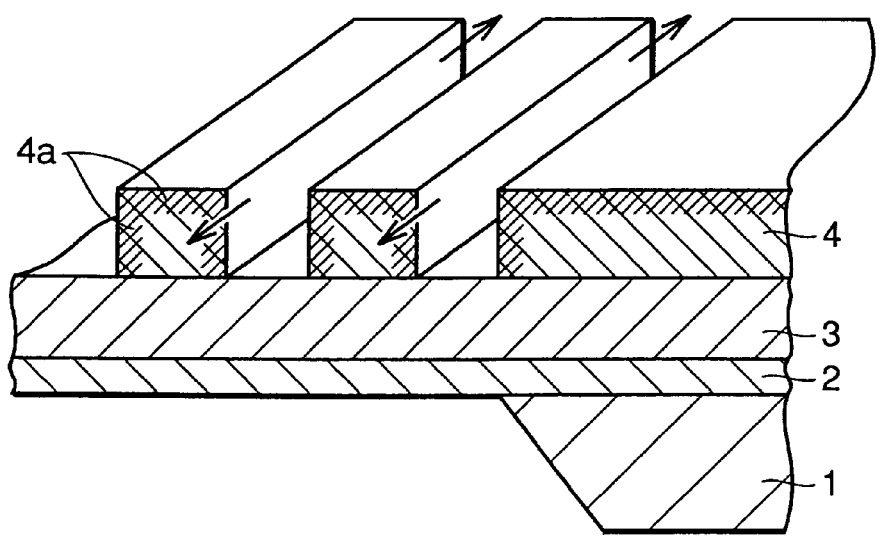
FIGS. 12 and 13 are sectional views of an X-ray mask indicating the sequence of a stress adjustment method according to a third embodiment of the present invention.

Referring to FIG. 12, an oxide film 4a is formed by native oxidation at the sidewall of X-ray absorber 4 after patterning of X-ray absorber 4 shown in FIG. 7. Therefore, compressive stress is generated at the sidewall, so that position offset of the pattern of X-ray absorber 4 occurs in the direction indicated by the arrow.

In the present embodiment, the stress adjust process includes, for example, annealing the X-ray mask when position offset occurs.

Figure 13:
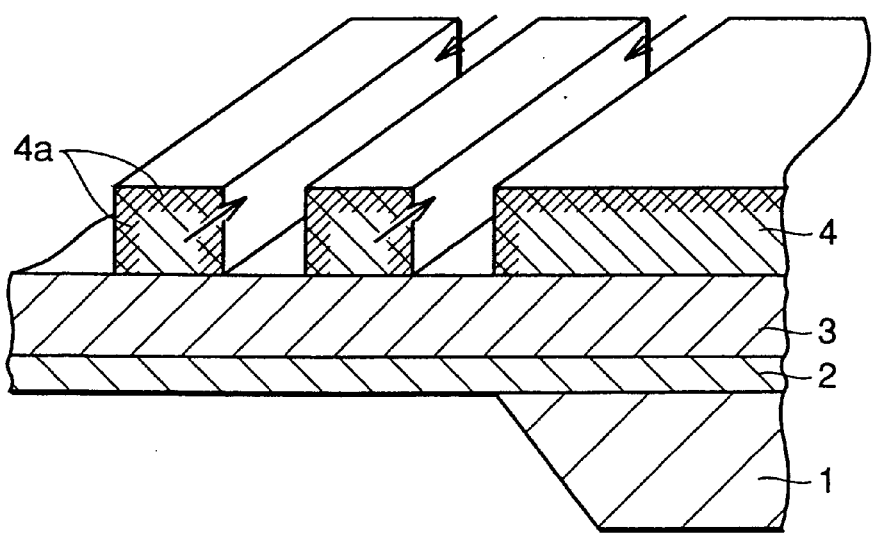

In general, the ambient gas component is introduced at the time of film growth with a lattice defect in X-ray absorber 4. By the annealing process, the ambient gas component introduced into X-ray absorber 4 is removed and the lattice defect eliminated. As a result, the stress of X-ray absorber 4 becomes more tensile corresponding to the removal of the ambient gas component and lattice defect as shown in FIG. 13. The pattern of X-ray absorber 4 is shifted in the direction indicated by the arrow to correct the position offset of the pattern.

In the present embodiment, position offset of the pattern caused by native oxidization of X-ray absorber 4 can be corrected by applying annealing after patterning X-ray absorber 4.

As an alternative to the above position offset correction by applying an annealing step, the pattern position offset can also be corrected by heating in reduction atmosphere to remove oxide film 4a such as the sidewall of X-ray absorber 4 to eliminate stress.

This reduction process is applicable when oxidation of X-ray absorber 4 proceeds gradually over a long period of time. With a material that is oxidized by being merely exposed to air, X-ray absorber 4 even if subjected to reduction will be oxidized as soon as it is taken out from the chamber. Therefore, the stress cannot be adjusted.

Fourth Embodiment

Figure 14:
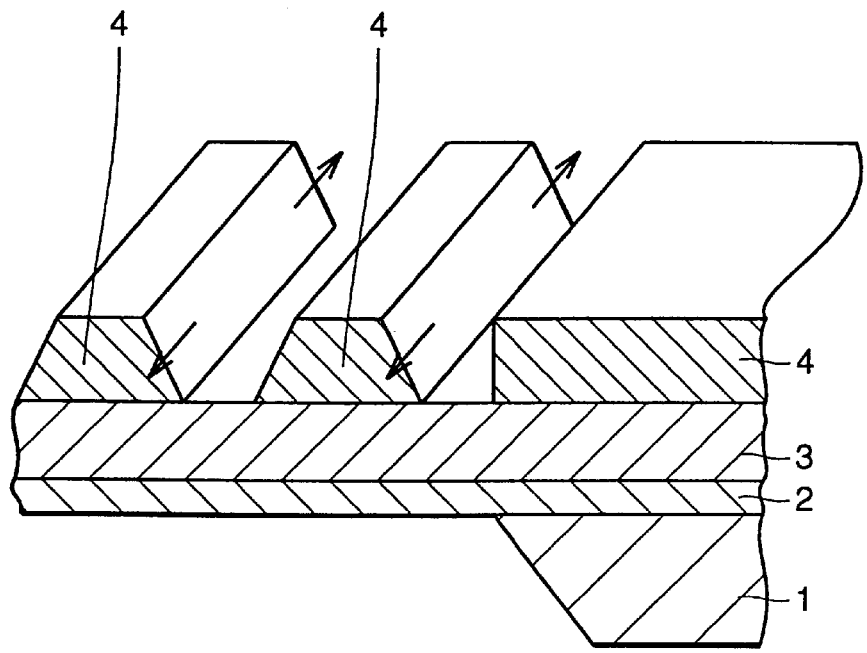
FIGS. 14 and 15 are sectional views of an X-ray mask indicating the sequence of a stress adjustment method according to a fourth embodiment of the present invention.

In the above step shown in FIG. 7, the sidewall pattern of X-ray absorber 4 may be patterned obliquely to achieve a phase shift effect. In this case, compressive stress is exerted at the sidewall of pattern 4b of X-ray absorber 4 as shown in FIG. 14. Position offset in the pattern of X-ray absorber 4 occurs in the direction indicated by the arrow.

In the present embodiment, the stress adjust process of the X-ray mask is carried out by annealing when this position offset occurs.

Figure 15:
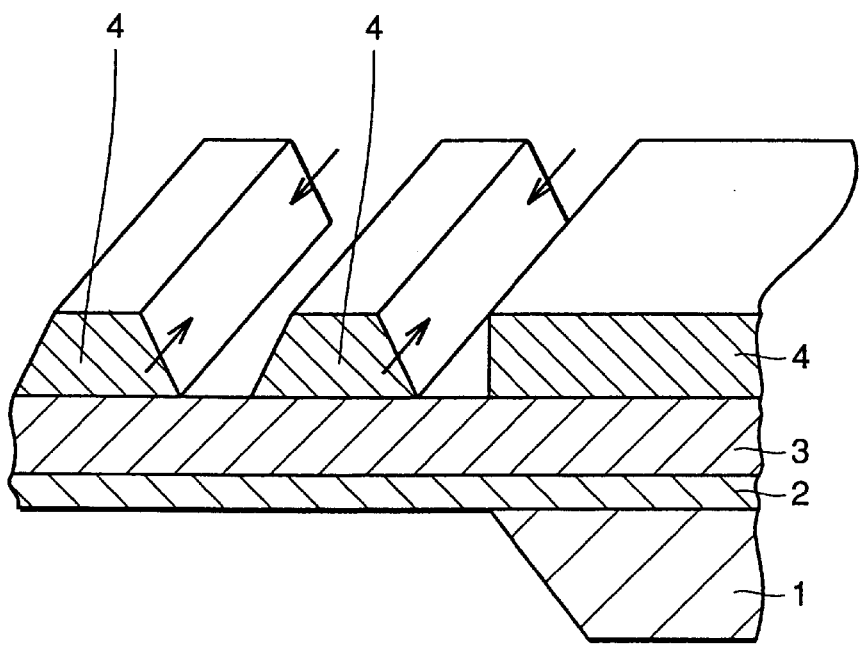

Referring to FIG. 15, this annealing step allows the ambient gas component and lattice defect to be removed from the pattern of X-ray absorber 4. As a result, the stress is rendered tensile. Accordingly, the pattern of X-ray absorber 4 is shifted in the direction indicated by the arrow to correct the pattern position offset.

In the present embodiment, the pattern position offset can be corrected while maintaining the phase shifting effect by carrying out the annealing step after patterning X-ray absorber 4.

When the phase shifting effect is not required, pattern 4b is etched again so that the sidewall of pattern 4b of X-ray absorber 4 is substantially perpendicular to the top surface of anti-reflective film 3. In this etching step, the sidewall is desirably etched slightly by isotropic etching.

Fifth Embodiment

When the X-ray mask is used in X-ray lithography, the bond between Si and O of the $SiO_2$ in anti-reflective film 3 is broken by irradiation with X-rays, resulting in a change in the stress. As a result, position offset of the pattern of X-ray absorber 4 is generated.

In order to prevent this offset, a process of altering the stress towards the tensile side, such as by annealing or reduction, is to be carried out when the stress of anti-reflective film 3 is compressive due to irradiation with X-rays. When the stress of anti-reflective film 3 is altered towards the tensile side by irradiation with X-rays, a process such as oxidation or ion implantation that alters the stress to be compressive is carried out.

In the present embodiment, position offset of the pattern can be corrected even when position of the pattern of X-ray absorber 4 is offset over time by X-ray radiation.

Sixth Embodiment

Figure 16:
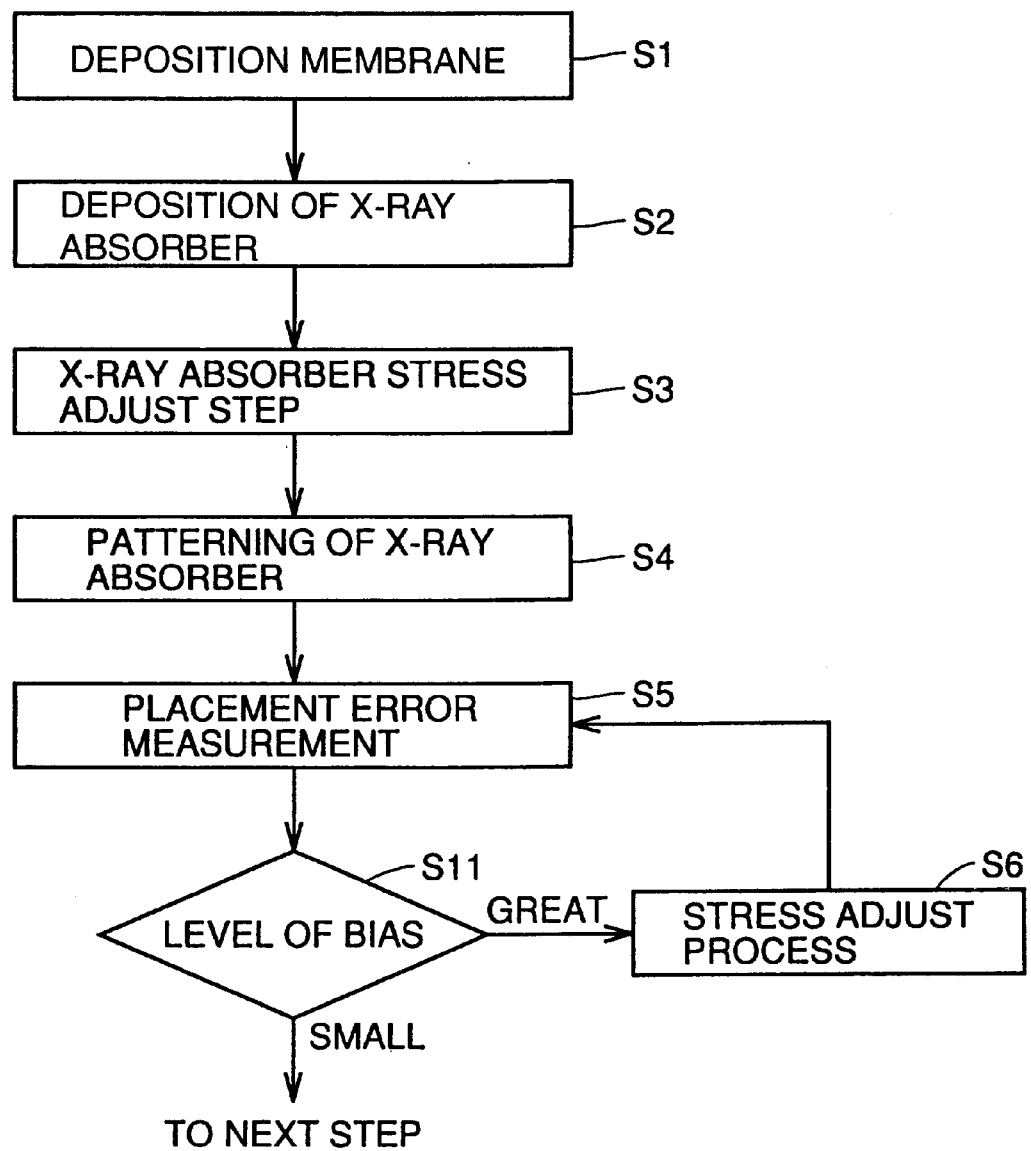
FIGS. 16 and 17 show an X-ray mask stress adjustment method according to sixth and seventh embodiments, respectively, of the present invention.

Referring to FIG. 16, following steps (S1–S4) similar to those of the first embodiment shown in FIG. 1, the placement error of the pattern of X-ray absorber 4 is measured by the laser interference method, electron beam writing, and the like (step S5).

Then, determination is made whether the measured bias is of a level that can be neglected or not neglected for X-ray lithography (step S11). When the measured bias is too great to be appropriate in X-ray lithography, a stress adjust process is applied on the X-ray mask (step S6).

By repeating the placement error measurement process (step S5) and the stress adjust process (step S6), the subsequent step can be carried out when the placement error of X-ray absorber 4 becomes small enough to be applicable for X-ray lithography.

In the present embodiment, the bias is reduced by repeating the placement error measurement step and the stress adjust processing step. By measuring several times the relationship between the change in the placement error and the change in the stress, the condition where the placement error is minimum can be estimated from the relationship. By carrying out a stress adjust process according to that condition, the placement error can be set to a low level acceptable for X-ray lithography.

The method of the present embodiment is particularly effective in the correction of defects of a pattern of high complexity. More specifically, the overall placement error of the X-ray mask is measured at the placement error measurement step (step S5). When the bias is great (step S11), the process of adjusting the stress locally (step S6) is repeated. Thus, the distribution of the local stress generated by correcting the defect in a pattern of great complexity can be adjusted more minutely.

Seventh Embodiment

Figure 17:
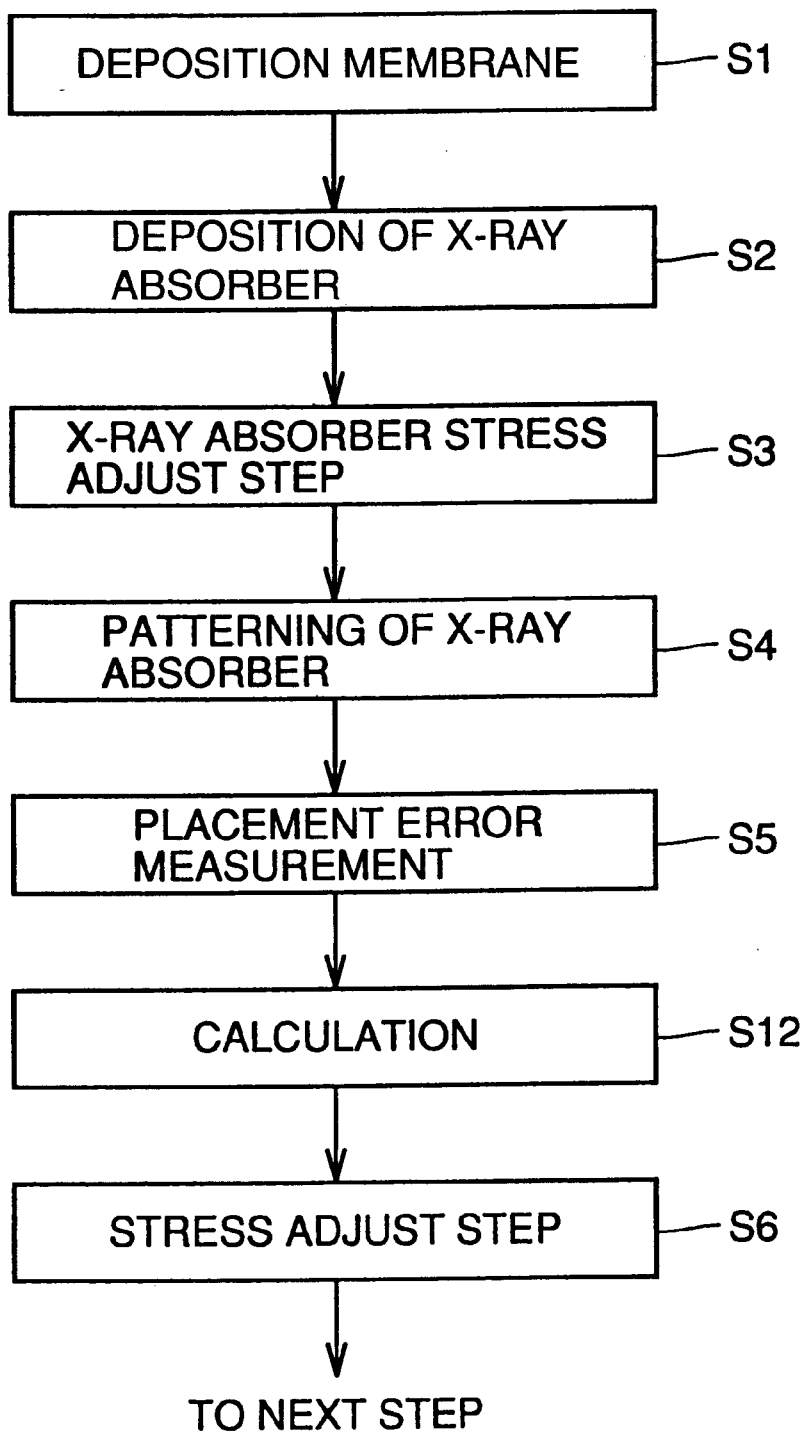

Referring to FIG. 17, steps (S1–S4) similar to those of the first embodiment shown in FIG. 1 are carried out in the present embodiment. Then, the offset in the pattern position of X-ray absorber 4 is measured by, for example, the laser interference method, electron beam writing, and the like (step S5). By applying the measured placement error to the ratio of a previously obtained pattern distribution to a stress change produced by the stress adjustment method, or to a measured result on a data base basis, the processing condition of setting the stress of a predetermined film to 0 can be computed (step S12). Stress adjustment is carried out according to the computed processing condition (step S6).

In the present embodiment, the stress adjust process according to computation and data base is carried out after measuring the placement error. Therefore, offset in the pattern position can be corrected without repeating the measurement step of the pattern position offset and the stress adjust process of X-ray absorber 4.

Eighth Embodiment

Figure 18:
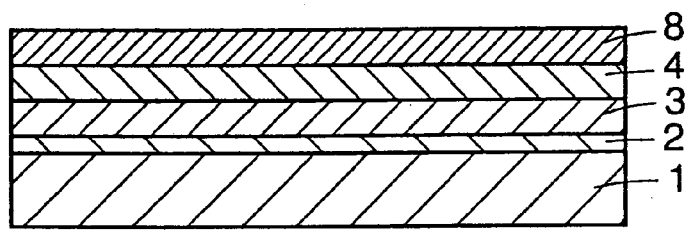
FIGS. 18–21 are sectional views of an X-ray mask indicating a sequence of a stress adjustment method according to an eighth embodiment of the present invention.

Referring to FIG. 18, a membrane 2 of a light element or component (for example SiC), an anti-reflective film 3, an X-ray absorber 4, and an etching mask 8 are sequentially formed on an X-ray mask substrate 1.

Figure 19:
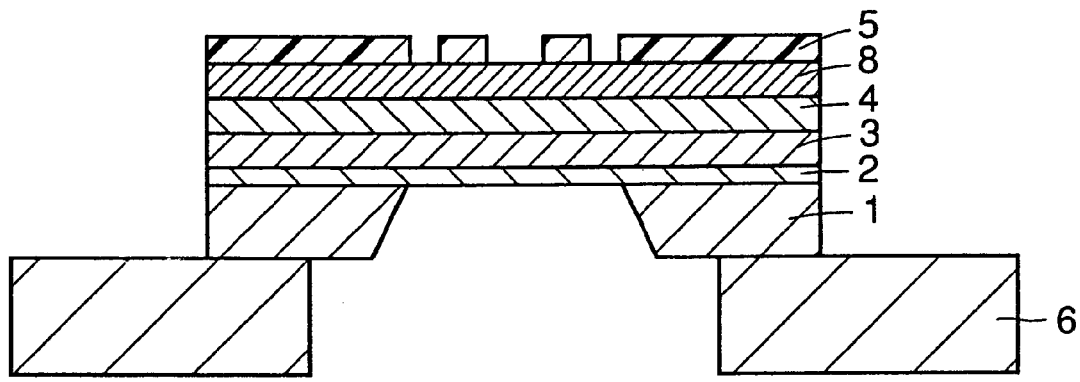

Referring to FIG. 19, a support ring 6 is attached at the bottom surface of X-ray substrate 1. Then, X-ray mask substrate 1 is etched back. Baking is carried out after applying a resist 5 on etching mask 8. Following a writing process by an electron beam writer (EB) on resist 8, development is carried out to produce resist pattern 5. Using resist pattern 5 as a mask, etching mask 8 is etched to be patterned. Using the patterned etching mask 8 as a mask, X-ray absorber 4 is etched. Then, resist 5 is removed.

Figure 20:
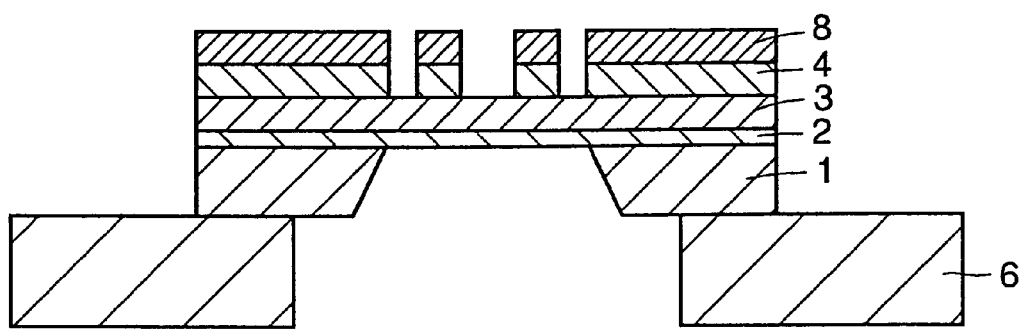

Referring to FIG. 20, X-ray absorber 4 is patterned by the above etching process.

Figure 21:
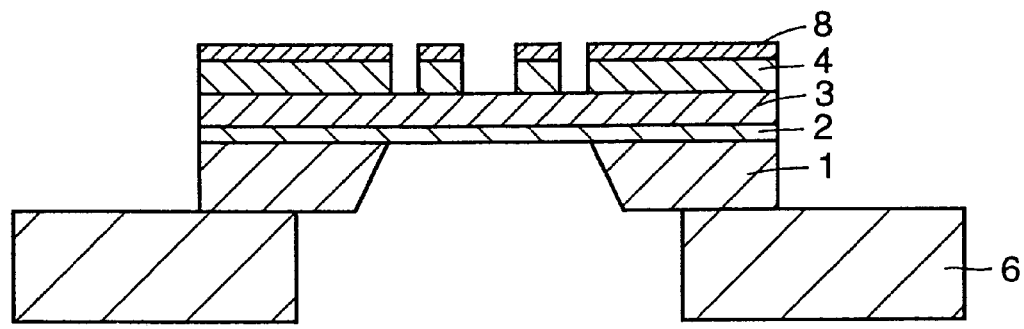

Then, the position accuracy of the pattern of X-ray absorber 4 is measured. If the measured result of the position accuracy is favorable, the X-ray mask is directly used as a mask for transfer. However, when the position accuracy of the pattern of X-ray absorber 4 is poor, etching mask 8 is etched. In this case, a uniform amount as shown in FIG. 21 (for example, half of the thickness of the etching mask) can be etched. Alternatively, local etching can be carried out. Then, the position accuracy of the pattern of X-ray absorber 4 is measured again. If the result thereof is favorable, the X-ray mask is used as a mask for transfer. When the measured result is not favorable, an etching step is applied again to etching mask 8.

The method of etching mask 8 after measuring the position accuracy can be additionally carried out when the position accuracy of the pattern of X-ray absorber 4 is degraded such as in the case when the X-ray mask is completed and actually used for transfer, or when the X-ray mask is subjected to a cleaning process.

The etching amount of mask 8 can be obtained from the measured result of the position accuracy of the pattern of X-ray absorber 4. Also, the placement error can be minimized by repeating a small amount of etching of mask 8 and position accuracy measurement without obtaining in advance the amount of etching that renders placement error to 0.

Adjustment of the position accuracy will be disabled when etching mask 8 is entirely etched away since the stress cannot be adjusted. However, the position accuracy of the pattern of X-ray absorber 4 can be adjusted by etching a small amount of X-ray absorber 4 after entirely removing etching mask 8 if within the range that does not affect transfer or that requires only modification of the transfer condition.

In the present embodiment, the steps of film growth of each of layers 2, 3, 4, 8→attachment of support ring 6→back etching→EB→etching of X-ray absorber 4 are employed. The stress adjustment method of the present embodiment is not limited to these steps. For example, the steps of film growth of each of layers 2, 3, 4, 8→back etching→attachment of support ring 6→EB→etching of X-ray absorber 4; the steps of back etching→film growth of each of layers 2, 3, 4, 8→attachment of support ring 6→etching of X-ray absorber 4; or the steps of film growth of each of layers 2, 3, 4, 8→EB→etching of X-ray absorber 4→attachment of support ring 6→back etching can be employed.

Ninth Embodiment

FIGS. 22A–27C have the same reference characters allotted to the same or similar components described as the eighth embodiment. Description of the same components will not be provided.

The position accuracy correction method when the resist is of the positive type and when the etching mask has tensile stress will be described hereinafter with reference to FIGS. 22A–22D and FIGS. 23A–23C.

Figure 22A:
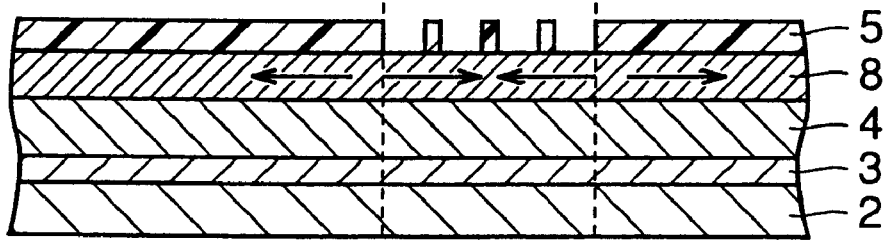
FIGS. 22A–22D show a stress adjustment method in sequence when the resist is of a positive type and the etching mask has tensile stress.

Referring to FIG. 22A, each of layers 2, 3, 4 and 8 are grown on an X-ray mask substrate (not shown). A resist 5 is applied on etching mask 8. Then, baking is carried out. Resist 5 is written by an electron beam writer. Next, development is carried out. Then, mask 8 is etched. X-ray absorber 4 is etched.

Figure 22B:
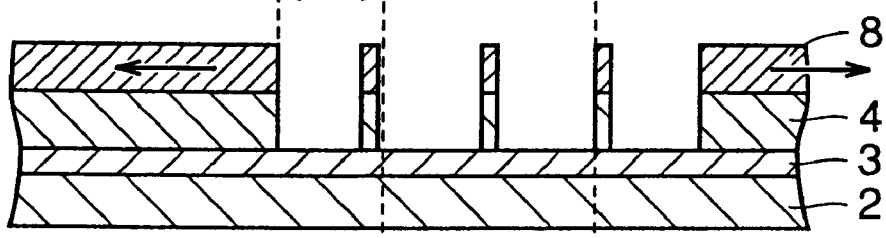
Figure 22C:
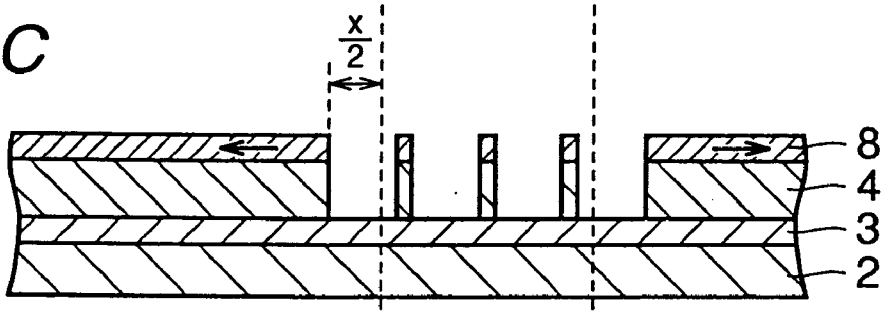
Figure 22D:
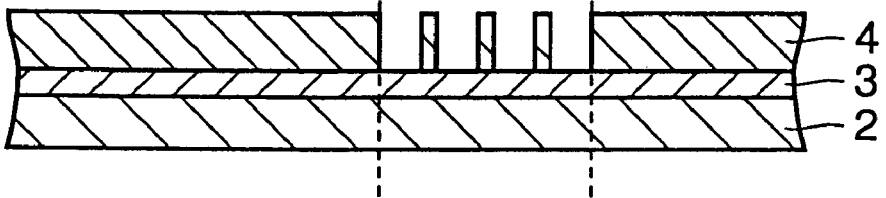

In the case where etching mask 8 has tensile stress, the pattern of etching mask 8 is enlarged by the dimension of x as shown in FIG. 22B after etching mask 8. Then, mask 8 is subjected to etching to have the thickness halved as shown in FIG. 22C. As a result, the tensile stress in etching mask 8 is reduced to half. If the stress of X-ray absorber 4 is 0, the pattern of etching mask 8 is shifted in the former direction by the dimension of x/2. When mask 8 is entirely removed as shown in FIG. 22D, the pattern is restored to the former proper position if the stress of X-ray absorber 4 is 0.

Figure 23A:
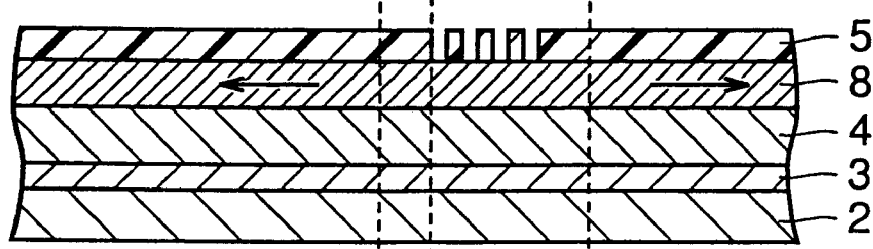
FIGS. 23A–23C show a stress adjustment method in sequence when there is residual stress in the X-ray absorber.
Figure 23B:
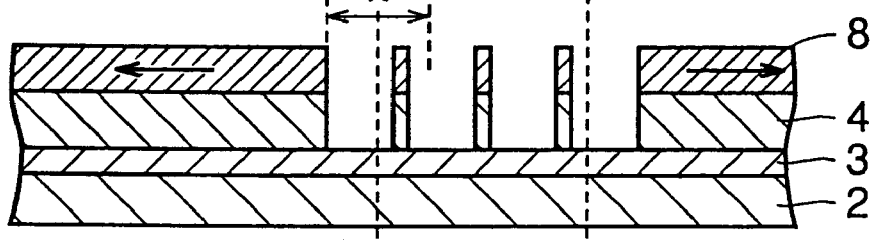

However, since there is residual stress in X-ray absorber 4, pattern bias in X-ray absorber 4 is still seen even after removing etching mask 8. Therefore, a method of intentionally writing the pattern smaller than the proper position by the dimension of $x_1$ as shown in FIG. 23A is employed. Here, dimension $x_1$ is set smaller than the dimension x. By etching mask 8 and X-ray absorber 4 as shown in FIG. 23B from this state, the pattern will be enlarged than the proper position by dimension $x_2$.

Figure 23C:
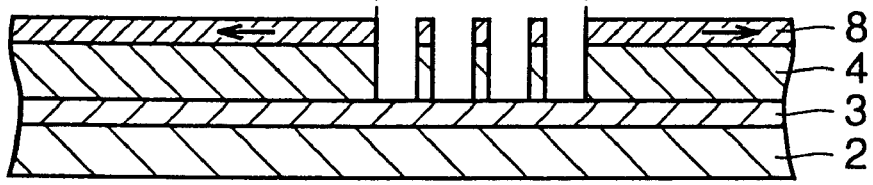

Here, the relationship of each dimension is $x=x_1+x_2$. The shifting amount of the pattern when mask 8 is entirely removed by etching is dimension x. By etching mask 8 just by an appropriate amount, the pattern will be shifted to the proper position. More specifically, assuming that the stress of etching mask 8 is uniform, an etching process that reduces the thickness of mask 8 by the ratio of $x_2/x$ causes the pattern to take the proper position as shown in FIG. 23C.

For example, when the thickness of mask 8 is 100 nm, and etching film 8 is reduced 20 nm in film thickness (the thickness of 80 nm remains) according to the selective etching ratio in etching X-ray absorber 4, the pattern is shifted x=40 nm by the stress of mask 8 having a thickness of 80 nm. In this case, by setting the pattern smaller by approximately $x_1+30$ nm in advance, the pattern is enlarged by about $x_2=10$ nm than the proper position after the etching process of X-ray absorber 4. Therefore, the ratio of $x_2/x$ becomes $x_2/x=10/40=0.25$. Therefore, the pattern is shifted to the proper position by etching mask 8 approximately 80 nm×0.25=20 nm.

In practice, the alignment is not so simple as etching mask 8 by 20 nm as in the above example due to the residual stress in X-ray absorber 4, unevenness in the stress of etching mask 8, and the pattern density. Therefore, by repeating the etching step of mask 8 by 5 nm and the position accuracy measurement step, the pattern position accuracy of X-ray absorber 4 can be further improved.

The position accuracy correction method in the case where the resist is of a positive type and the etching mask has compressive stress will be described hereinafter with reference to FIGS. 24A–24D and FIGS. 25A–25C.

Referring to FIG. 24A, likewise the above process, resist 5 is patterned after growing each of layers 2, 3, 4 and 8. Referring to FIG. 24B, mask 8 and X-ray absorber 4 are etched, so that the pattern is shrunk by dimension y from the proper position due to the compressive stress in etching mask 8. Then, by etching mask 8 to half the film thickness, the compressive stress in etching mask 8 is halved as shown in FIG. 24C. Therefore, the pattern is shifted towards its proper position by dimension y/2 if the stress of X-ray absorber 4 is 0. Also, the pattern returns to the former position when mask 8 is entirely removed by etching as shown in FIG. 24D if the stress of X-ray absorber 4 is 0.

In practice, there is residual stress in X-ray absorber 4. Therefore, the pattern is biased even after mask 8 is removed. Therefore, by writing the pattern greater than the proper position by dimension $y_1$ (<y) as shown in FIG. 25A, the pattern will be smaller by dimension $y_2$ than the proper position after X-ray absorber 4 is etched as shown in FIG. 25B. When mask 8 is entirely removed by etching, the pattern is shifted by y. Therefore, assuming that the stress of etching mask 8 is uniform, the pattern is shifted to the proper position as shown in FIG. 25C by reducing the thickness of etching mask 8 by the ratio of $y_2/y$. The position accuracy can be improved by repeating the etching step of mask 8 and the position accuracy measurement step.

The position accuracy correction method of the case where the resist is of a negative type and when etching mask 8 has tensile stress will be described hereinafter with reference to FIGS. 26A–26C and 27A–27C.

Figure 26A:
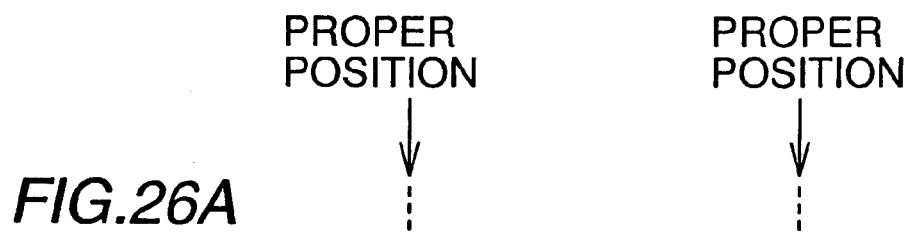
FIGS. 26A–26C show a stress adjustment method in sequence when the resist is of a negative type and the etching mask has tensile stress.
Figure 26B:
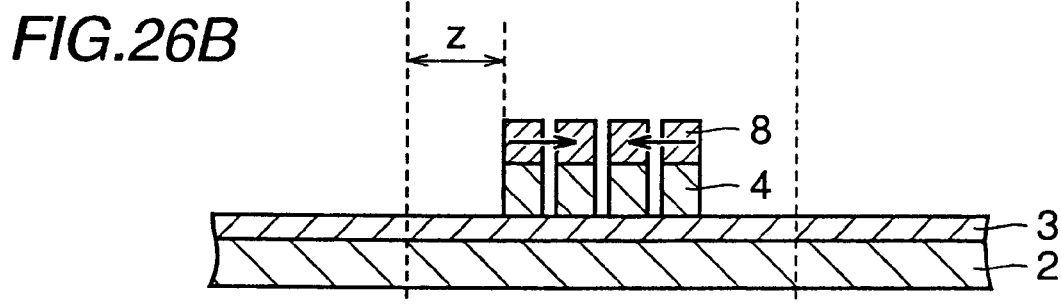
Figure 26C:
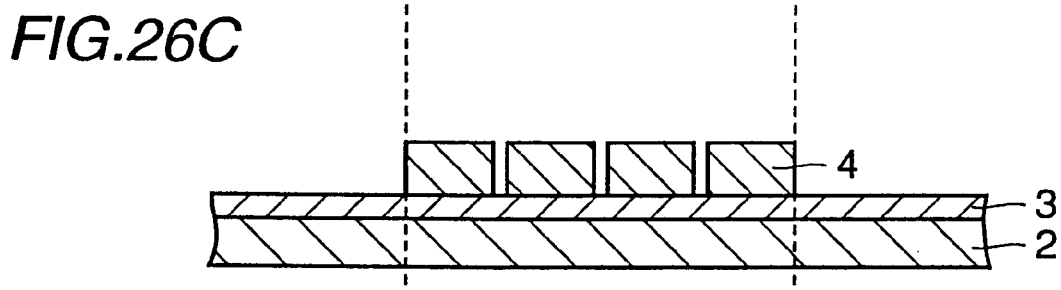

Referring to FIG. 26A, similar to the above process, each of layers 2, 3, 4, and 8 are grown. Then, resist 5 is patterned. Referring to FIG. 26B, etching mask 8 and X-ray absorber 4 are patterned, so that the pattern is shrunk from the proper position by dimension z due to the tensile stress of etching mask 8. When mask 8 is entirely removed by etching as shown in FIG. 26C, the pattern will return to the former position if the stress of X-ray absorber 4 is 0.

In practice, there is residual stress in X-ray absorber 4, so that the pattern is biased even after etching mask 8 is removed. By writing the pattern intentionally greater than the proper position by dimension $z_1$ (<z) as shown in FIG. 27A, the pattern becomes smaller than the proper position by dimension $z_2$ after X-ray absorber 4 is etched as shown in FIG. 27B.

The relationship between each dimension is $z=z_1+z_2$. The shifted amount of the pattern is dimension z when etching mask 8 is entirely removed by etching. By etching mask 8 by the ratio of $z_2/z$ after etching X-ray absorber 4, the pattern is shifted to the proper position as shown in FIG. 27C. The position accuracy can be improved by repeating the etching step of mask 8 and the position accuracy measurement step.

The same applies for the position accuracy correction method when the resist is of a negative type and etching mask 8 has compressive stress.

Here, a positive type resist 5 is used when X-ray absorber 4 is to be left at the periphery of the X-ray mask. A negative type resist 5 is used when absorber 4 is not to be left at the periphery. In the case of a positive type resist 5, the portion of resist 5 that is subjected to EB writing will be eliminated. Therefore, resist 5 will remain at the periphery that is not required to be subjected to EB writing. As a result, the periphery portion will be covered by X-ray absorber 4. Conversely, in the case where a negative type resist 5 is employed, only the portion of resist 5 corresponding to the EB written portion remains. Therefore, the peripheral resist 5 is eliminated. As a result, X-ray absorber 4 at the periphery is etched.

Neglecting the time required for EB writing, the periphery portion absent of a pattern can be written by EB for either a positive type resist or a negative type resist. In this case, an effect opposite to that described above is obtained. For example, FIGS. 24 and 25 correspond to the case where only the center area is subjected to EB writing using a positive type resist. This is identical, using a negative type resist, to the effect where all the portions that were not written by the above positive type resist (including the peripheral region). Therefore, the EB writing process of a portion opposite to that of a normal case including the peripheral area is completely opposite to that described above. However, the basic concept is identical.

Tenth Embodiment

Components in FIGS. 28A–30C corresponding to those described as the eighth embodiment have the same reference characters allotted, and their description will not be repeated.

First, writing a portion (including the peripheral portion) using a positive type resist or an opposite portion to that of the positive type resist using a negative type resist will be described with reference to FIGS. 28A–28C. Here, the stress of the etching mask is a tensile stress. It is particularly desirable that the peripheral portion of the etching mask have a tensile stress.

Figure 28A:
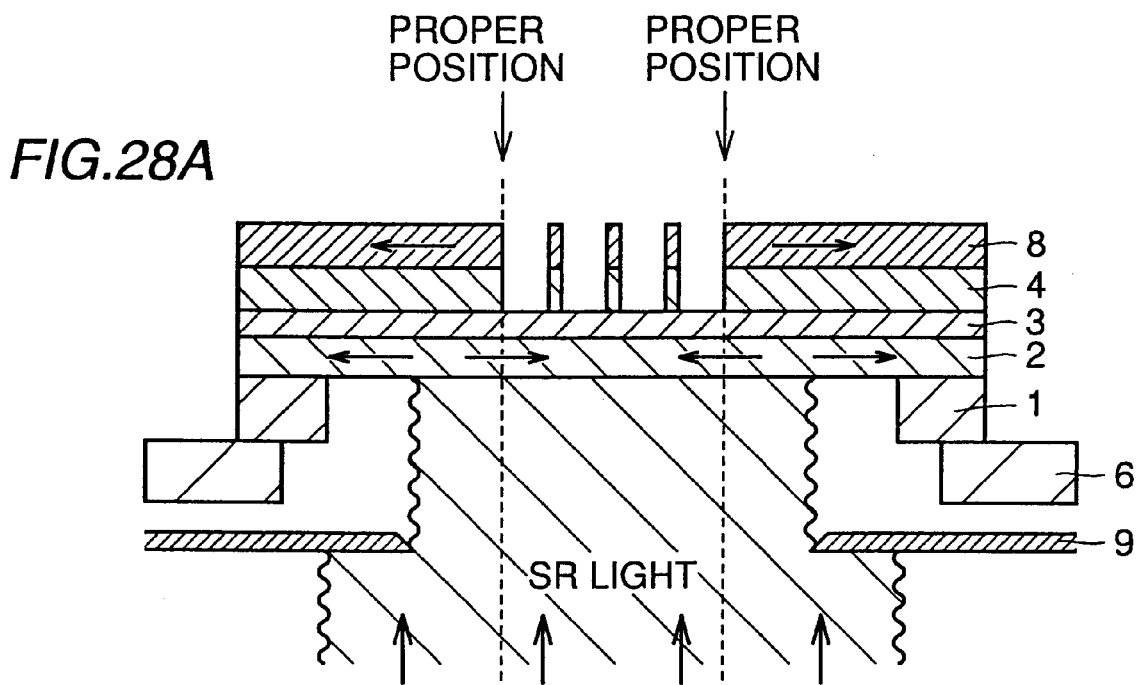
FIGS. 28A–28C show a stress adjustment method in sequence when SR light is projected.
Figure 28B:
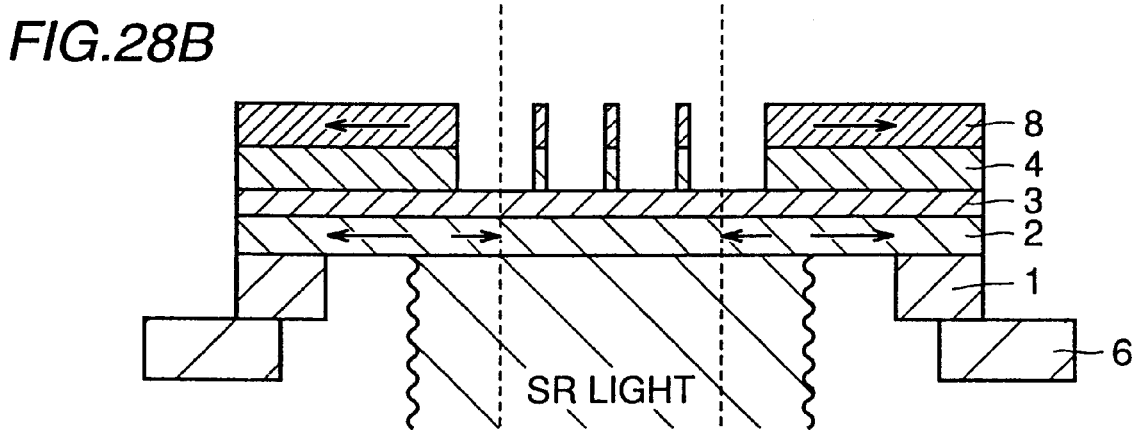
Figure 28C:
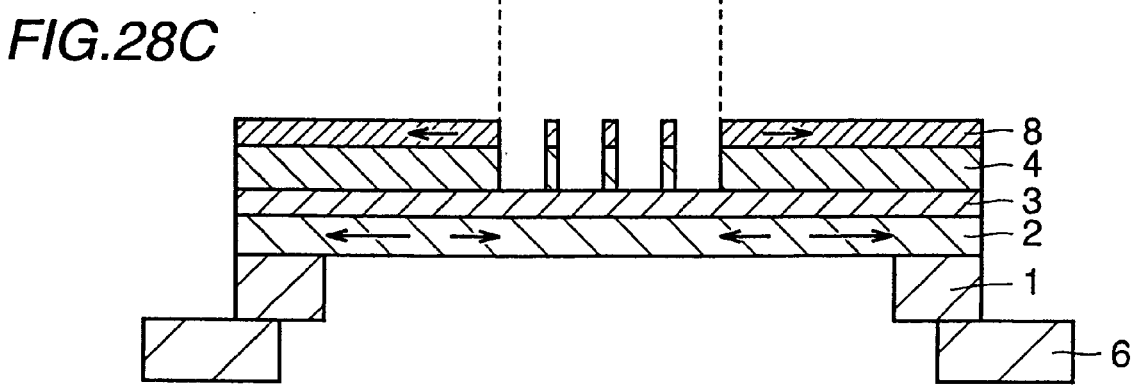

Referring to FIG. 28A, in the case of SR (Synchrotron Radiation) transfer, a blind 9 is provided to cut the SR light at the end of the chip to prevent multiplex transfer of the boundary of an adjacent chip. As a result, membrane 2 will include a portion subjected to SR light and a portion not subjected to SR light. The tensile stress of membrane 2 is gradually reduced at the area constantly subjected to the SR light in continuing the SR transfer. As a result, the pattern will expand totally as shown in FIG. 28B. By etching mask 8 having a tensile stress for a certain thickness as shown in FIG. 28C, the pattern is totally shrunk since the tensile stress at the outer side of the mask is reduced. As a result, position offset caused by SR light can be corrected.

Oxidation of the X-ray absorber, anti-reflective film, etching stopper and the like by sulfuric acid hydrogen peroxide cleaning, air exposure, SR and the like will be described hereinafter with reference to FIGS. 29A–29C.

Figure 29A:
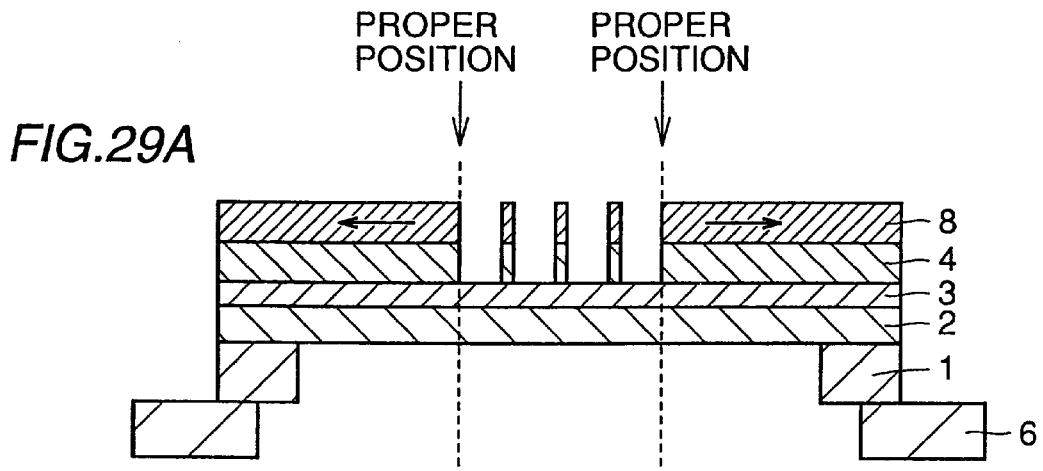
FIGS. 29A–29C show a stress adjustment method in sequence when the X-ray absorber, the anti-reflective film, and the etching stopper are oxidized.
Figure 29B:
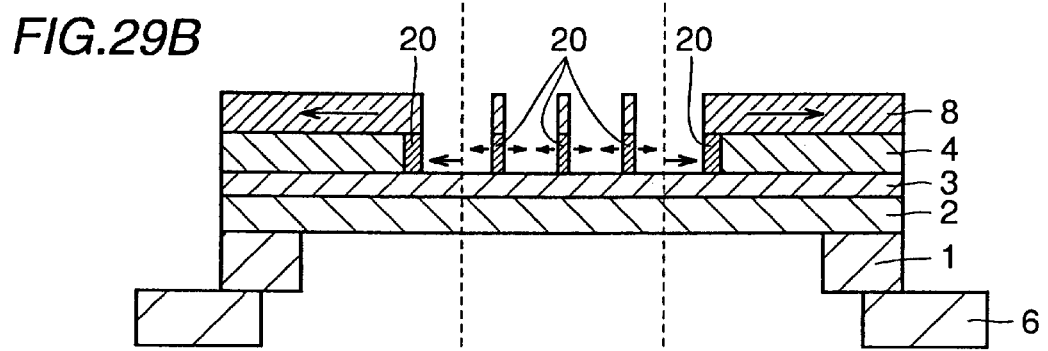
Figure 29C:
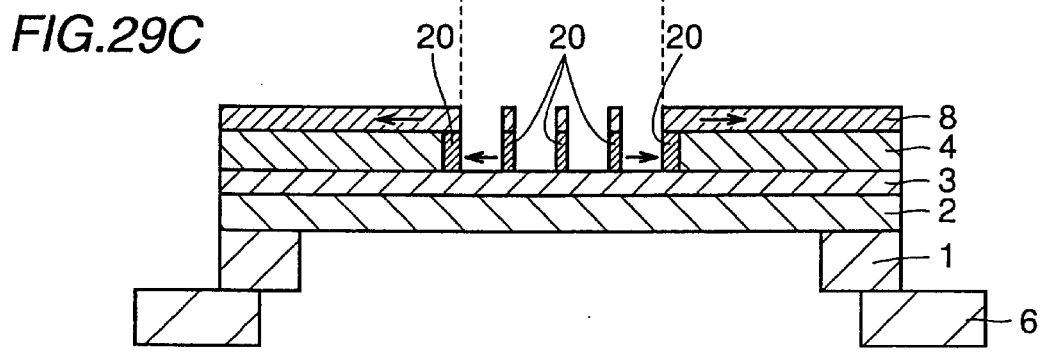

When sulfuric acid hydrogen peroxide cleaning, air exposure, SR and the like is applied in the state shown in FIG. 29A, X-ray absorber 4 and the like are oxidized to form an oxide film 20 as shown in FIG. 29B. Compressive stress corresponding to the introduced oxygen is developed in oxide film 20, so that the whole pattern expands. By etching a predetermined amount of mask 8 that has tensile stress as shown in FIG. 29C, the tensile stress can be relaxed to result in the former pattern.

Here, measures with respect to oxidation by a cleaning process is described. There may be a case where the oxide film is removed during the cleaning process. In this case, the pattern is entirely shrunk since the pattern is pulled. By developing in advance compressive stress in etching mask 8, the position accuracy can be corrected since the pattern expands by etching mask 8.

The case of writing (including the periphery) using a negative resist or writing the portion opposite to that of the negative resist using a positive resist will be described with reference to FIGS. 30A–30C. In this case, the stress of the etching mask is opposite to that of the previous case, i.e. compressive stress is required.

Figure 30A:
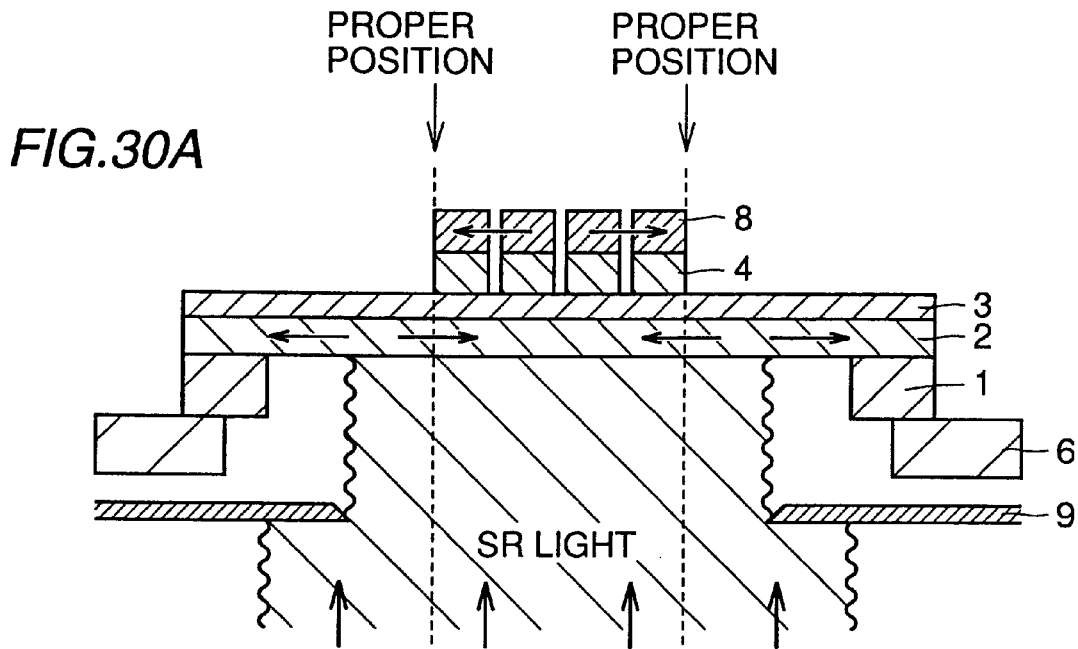
FIGS. 30A–30C show a stress adjustment method in sequence when SR light is projected.
Figure 30B:
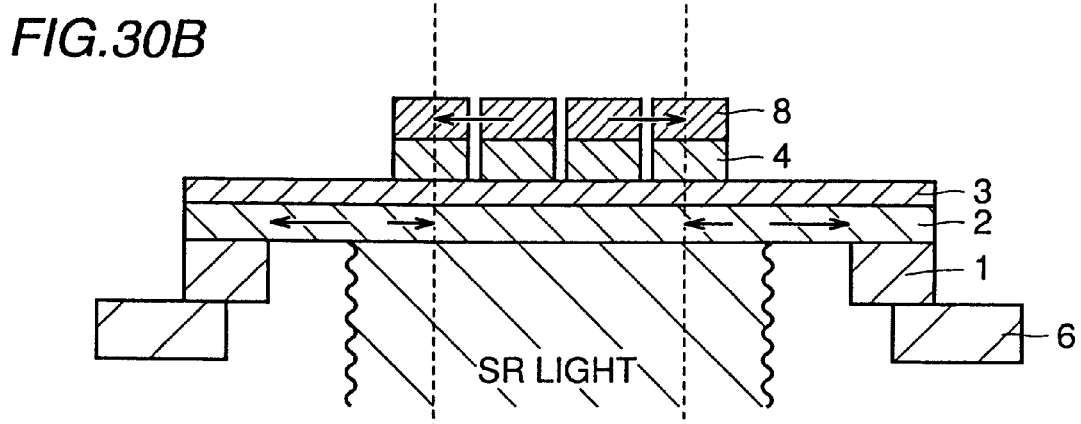
Figure 30C:
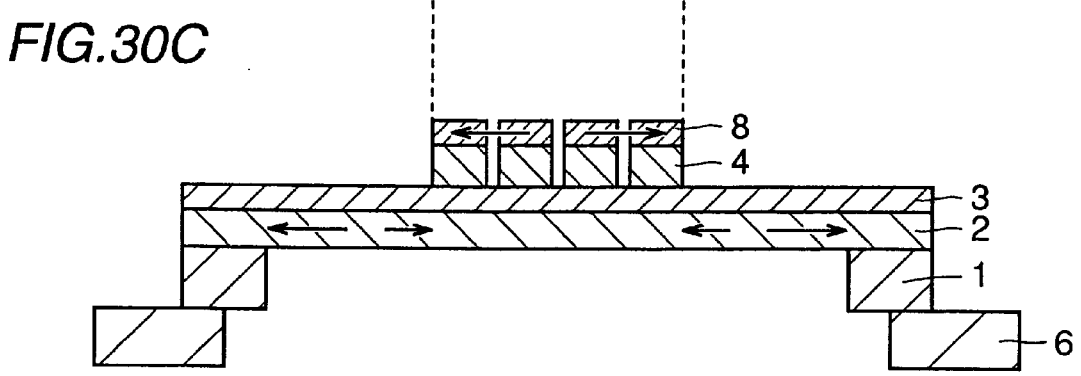

Referring to FIG. 30A, SR light is applied. The stress in membrane 2 corresponding to the area subjected to the SR light is reduced. Therefore, the entire pattern expands as shown in FIG. 30B. By etching a predetermined amount of mask 8 having compressive stress as shown in FIG. 30C, the compressive stress in mask 8 is reduced, so that the pattern becomes smaller. Thus, position offset by the SR light can be amended.

The pattern tends to expand in the case of oxidation of the X-ray absorber, anti-reflective film, etching stopper, and the like by cleaning, air exposure, SR, and the like. Therefore, by developing in advance compressive stress at the etching mask similar to FIG. 30, position strain can be amended by etching an appropriate amount.

When the oxide film is removed by cleaning and the like, the pattern will be pulled to result in a smaller pattern. Therefore, by developing tensile stress beforehand in the etching mask, the pattern can be expanded as a result of relief of the tensile stress by etching a predetermined amount of the mask. Thus, the position accuracy can be improved.

Here, the stress of membrane 2 is relaxed by SR light. There are cases where the stress may be increased depending upon the film material. In this case, position accuracy can be amended by setting a stress opposite to that of the above case in the etching mask.

Eleventh Embodiment

The method of adjusting the stress after patterning the X-ray absorber was described in the previous embodiments. This method is preferably combined with the stress adjustment method prior to patterning the X-ray absorber. In the present embodiment, a method of preventing pattern bias caused by overetching at the time of etching the X-ray absorber will be described.

Figure 31:
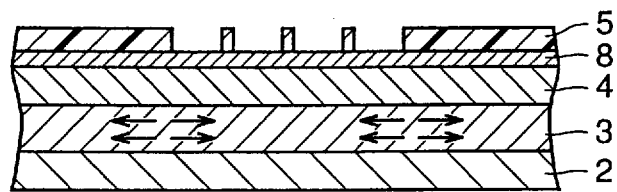
FIGS. 31–33 show in sequential order the manner of the underlying layer of the X-ray absorber being overetched.
Figure 32:
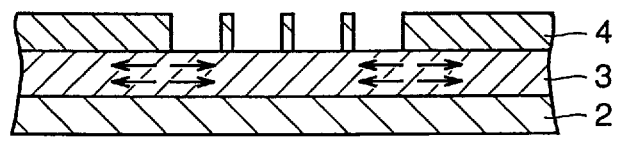

After each of films 2, 3, 4 and 8 are grown and a pattern resist 5 is provided, as shown in FIG. 31, etching mask 8 and X-ray absorber 4 are patterned by an etching step as shown in FIG. 32. In the etching of X-ray absorber 4, overetching is generally effected. When the etching selectivity is extremely high, the underlying membrane 2, anti-reflective film 3, the etching stopper and the like (referred to as "underlying layer" hereinafter) are not etched at all. Therefore, the pattern will not be biased even if the underlying layer has a stress, as long as the stress of X-ray absorber 4 is 0.

Figure 33:
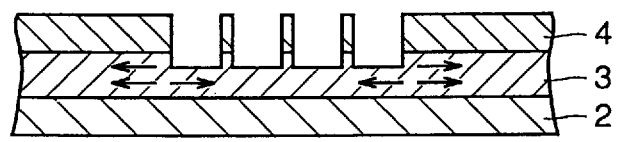

However, if the selectivity is poor, the underlying layer will be partially removed by the overetching process of X-ray absorber 4 as shown in FIG. 33. In the case where the underlying layer has tensile stress, the pattern will expand outwards even if the stress of X-ray absorber 4 is 0. This corresponds to the case using a positive type resist in FIG. 31. The pattern will shrink inwards when resist 5 is of the negative type.

Figure 34:
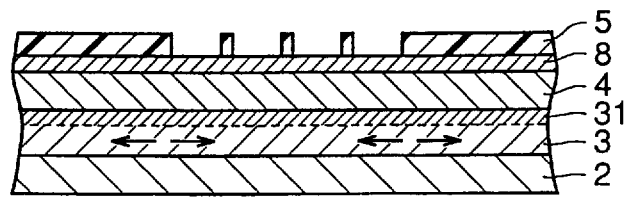
FIGS. 34 and 35 show a stress adjustment method of an X-ray mask in sequence according to a tenth embodiment of the present invention.
Figure 35:
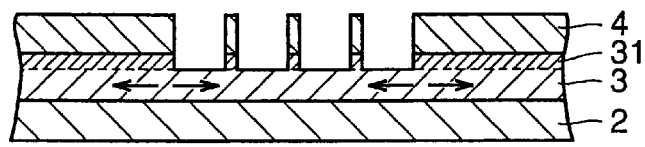

By setting the stress to 0 or to a negligible small level corresponding to the etched depth (surface layer 31) of the underlying layer (for example, anti-reflective film 3) of X-ray absorber 4 as shown in FIG. 34, the pattern will not be biased even when the underlying layer is overetched as shown in FIG. 35.

Figure 36:
FIG. 36 shows a step of forming an underlying layer of the X-ray absorber.
Figure 37:
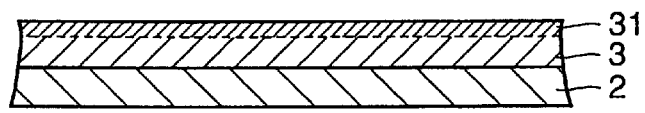
FIG. 37 shows the step of setting a stress at the surface of the underlying layer of the X-ray absorber to the vicinity of 0.
Figure 38:
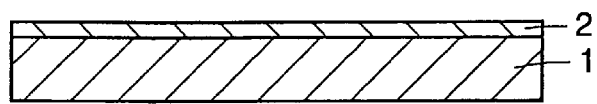
FIGS. 38–44 are sectional views of a conventional X-ray mask in sequence showing a fabrication method thereof.
Figure 39:
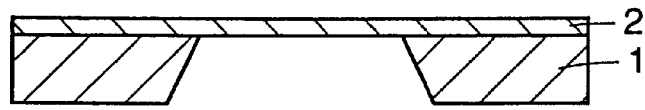
Figure 40:
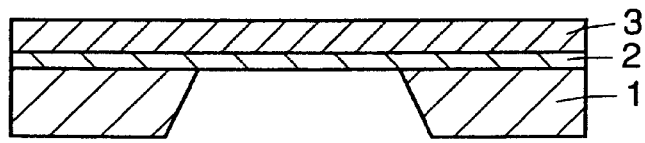
Figure 41:
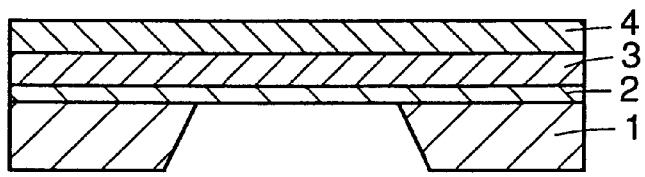
Figure 42:
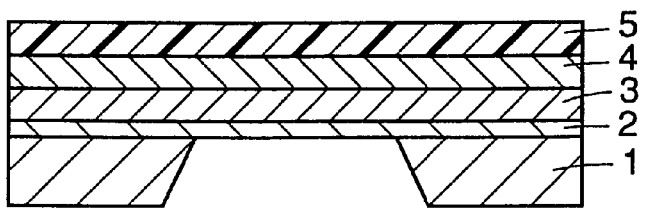
Figure 43:
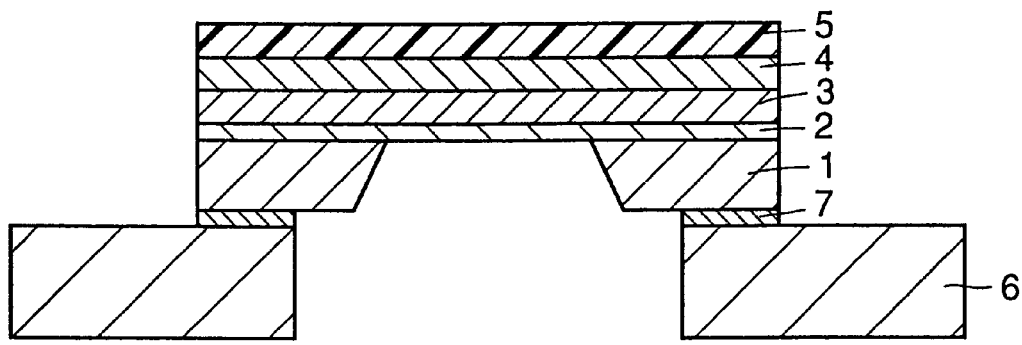
Figure 44:
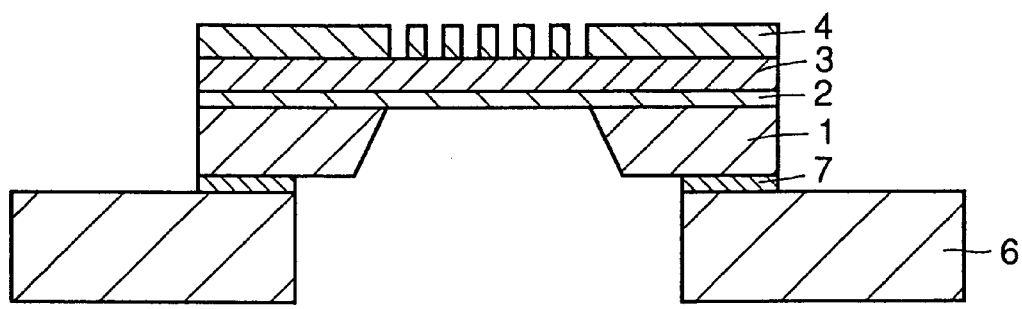

The method of decreasing the stress of the portion of the underlying layer that will be etched away is set forth in the following. Referring to FIG. 36, the film growth condition is altered during the growth of underlying layer 3 on membrane 2, whereby the stress of surface layer 31 of underlying layer 3 can be reduced as shown in FIG. 37.

The stress of surface layer 31 of underlying layer 3 can be adjusted towards the compressive side to approach 0 by implanting ions into underlying layer 3 after formation thereof.

Alternatively, the stress can be adjusted to the vicinity of 0 by applying oxidation or reduction on surface layer 31 of underlying layer 3 after the underlying layer is grown.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of stress adjustment of an X-ray mask comprising applying a stress adjusting process to an X-ray mask, including an X-ray absorber of a material that blocks transmission of X-rays, after patterning said X-ray absorber, the stress adjusting process including at least one process selected from the group consisting of annealing, etching, film deposition, oxidation, and chemical reduction of said X-ray mask.

2. The method of stress adjustment of an X-ray mask according to claim 1, comprising
   forming under said X-ray absorber an anti-reflective film of a material that prevents reflection of alignment light,
   patterning said X-ray absorber by selectively etching said X-ray absorber until a surface of said anti-reflective film is exposed, and
   oxidizing the surface of said anti-reflective film exposed by patterning.

3. The method of stress adjustment of an X-ray mask according to claim 1, including applying a stress adjusting process by annealing said X-ray absorber after patterning and forming an oxide film at a sidewall of said X-ray absorber.

4. The method of stress adjustment of an X-ray mask according to claim 1, including
   patterning said X-ray absorber by etching to produce an oblique sidewall of said X-ray absorber, and
   applying a stress adjusting process includes annealing said X-ray absorber.

5. The method of stress adjustment of an X-ray mask according to claim 1, comprising
   measuring placement error of said X-ray absorber, after patterning, and
   adjusting stress of said X-ray mask according to the measured placement error.

6. The method of stress adjustment of an X-ray mask according to claim 5, including reducing the placement error by repeatedly measuring placement error of said X-ray absorber and adjusting the stress of said X-ray mask.

7. The method of stress adjustment of an X-ray mask according to claim 5, comprising
   calculating a processing condition in which the placement error of the pattern of said X-ray absorber is substantially 0 and
   applying the stress adjusting process to said X-ray mask using the processing condition calculated.

8. The method of stress adjustment of an X-ray mask according to claim 1, including applying the stress adjusting process after exposing said X-ray mask to X-rays.

9. A method of stress adjustment of an X-ray mask including:
   depositing a film of an X-ray absorber on a supporting substrate;
   depositing a mask layer on said film of said X-ray absorber;
   depositing a resist on said mask layer and forming a pattern in said resist, exposing parts of said mask layer;
   patterning said mask layer using the pattern of said resist, exposing parts of said film of said X-ray absorber;
   etching said X-ray absorber using the pattern of said mask layer as an etching mask; and
   applying a stress adjusting process to adjust stress in said X-ray mask, after measuring position accuracy of said X-ray absorber, by etching said mask layer.

10. The method of stress adjustment of an X-ray mask according to claim 9, including adjusting the stress in said X-ray mask by etching said mask layer and leaving a portion of said mask layer on said X-ray absorber.

11. The method of stress adjustment of an X-ray mask according to claim 9, including adjusting the stress in said X-ray mask by etching said mask layer so that no portion of the mask layer is left on said X-ray absorber.

12. The method of stress adjustment of an X-ray mask according to claim 11, including adjusting the stress in said X-ray mask by etching and completely removing said mask layer and thereafter etching said X-ray absorber to remove a portion of said X-ray absorber.

13. The method of stress adjustment of an X-ray mask according to claim 9, including repeatedly measuring the position accuracy of said X-ray absorber and etching said mask layer to adjust the stress in said X-ray mask.

14. The stress adjustment of an X-ray mask according to claim 9, wherein, when said resist is a positive resist and said mask layer has a tensile stress, or said resist is a negative resist and said mask layer has a compressive stress, making a pattern region of said resist smaller than a pattern region of said X-ray absorber to adjust the stress in said X-ray mask.

15. The method of stress adjustment of an X-ray mask according to claim 9, wherein, when said resist is a positive resist and said mask layer has a compressive stress or when said resist is a negative resist and said mask layer has tensile stress, making a pattern region of said resist larger than a pattern region of said X-ray absorber to adjust stress in said X-ray mask.

16. The method of stress adjustment of an X-ray mask according to claim 9, including depositing a positive resist when said mask layer has a tensile stress.

17. The method of stress adjustment of an X-ray mask according to claim 9, including depositing a positive resist when said mask layer has a compressive stress.

18. A method of stress adjustment of an X-ray mask comprising applying a stress adjusting process to an X-ray mask, including an X-ray absorber of a material that blocks transmission of X-rays, after patterning said X-ray absorber and after measuring placement error of said x-ray absorber.

* * * * *